United States Patent
Shibata et al.

(10) Patent No.: US 6,873,533 B2
(45) Date of Patent: Mar. 29, 2005

(54) UNBUFFERED MEMORY SYSTEM

(75) Inventors: Kayoko Shibata, Tokyo (JP); Yoji Nishio, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 195 days.

(21) Appl. No.: 10/309,072

(22) Filed: Dec. 4, 2002

(65) Prior Publication Data

US 2003/0149855 A1 Aug. 7, 2003

(30) Foreign Application Priority Data

Dec. 5, 2001 (JP) .................................. 2001-371798

(51) Int. Cl.⁷ ............................................... G11C 5/02
(52) U.S. Cl. ..................................... 365/52; 365/230.03
(58) Field of Search ............................ 365/51, 52, 63, 365/230.03

(56) References Cited

U.S. PATENT DOCUMENTS

| | | | | |
|---|---|---|---|---|
| 6,034,878 A | * | 3/2000 | Osaka et al. .................. | 365/52 |
| 6,370,053 B2 | * | 4/2002 | Chang et al. .................. | 365/52 |
| 6,438,014 B2 | * | 8/2002 | Funaba et al. ................. | 365/52 |

* cited by examiner

*Primary Examiner*—Trong Phan
(74) *Attorney, Agent, or Firm*—Sughrue Mion, PLLC

(57) ABSTRACT

A memory module of the unbuffered type with ECC function is employed. Configuration of an internal C/A bus is set to a single T-branch topology. An output impedance of a chipset is maintained substantially constant. A capacitor for cutting high-frequency components of a C/A signal is added on a C/A bus.

37 Claims, 19 Drawing Sheets

φ1:UPON HIGH LEVEL, 18pcs MODULE IS USED
φ2:UPON HIGH LEVEL, 9pcs MODULE IS USED
φ3:UPON HIGH LEVEL, 4pcs MODULE IS USED

UNBUFFERED MEMORY SYSTEM

BACKGROUND OF THE INVENTION

1. Field of the Invention

The present invention relates to a memory system having a memory module and, in particular, relates to a memory system having, as a memory module, an unbuffered memory module with no buffer or register.

2. Description of the Related Art

In general, memory systems each comprise a memory module mounted thereon with memory devices, a memory controller for outputting information necessary for operations of the memory devices mounted on the memory module, i.e. command/address (C/A) signals, input data signals and so on, and a signal bus connecting between the memory controller and the memory module. For example, when the memory module is used as a main memory in a computer system, the memory controller is in the form of a chipset or the like and the signal bus is in the form of wirings extended on a mother board.

Among them, the memory modules are roughly classified into memory modules with registers (or memory modules with buffers) and unbuffered memory modules, The former is of the type having a command/address (C/A) register (or buffer) on a module substrate, while the latter is of the type having no C/A register or buffer on a module substrate.

In the memory module with register, a C/A signal sent from a memory controller is once received in a C/A register (or buffer), then distributed to memory devices mounted on a module substrate, respectively. On the other hand, in the unbuffered memory module, a C/A signal sent from a memory controller is directly distributed to all memory devices mounted on a module substrate. In other words, in the memory module with register, the capacitance seen from a C/A output terminal of the memory controller is only a capacitance of a C/A input terminal of the register or buffer, while, in the unbuffered memory module, capacitances of C/A input terminals of all the memory devices mounted on the module substrate are seen. In view of this, it has been generally carried out that when an stabler operation is sought, the memory system having the memory module with register is used, while, when giving weight to the cost, the unbuffered memory module with no buffer or register is used because the cost of the C/A register is not incurred.

With respect to the topology of a bus serving as a distribution path for C/A signals on the module substrate (hereinafter referred to as "internal C/A bus"), various proposals have been offered. As typical bus topologies, there have been known a topology having a one-step layer (hereinafter referred to as "single T-branch topology"), and a topology having two-step layers (hereinafter referred to as "dual T-branch topology"). In general, when the number of the mounted devices is large, the dual T-branch topology is better than the single T-branch topology in that inasmuch as the dual T-branch topology is approximate to equal-length wiring, differences in signal propagation delay amount on the internal C/A bus for the respective devices can be reduced as compared with the single T-branch topology being unequal-length wiring.

In recent years, improvement in data transfer rate has been strongly demanded in the field of memory devices and, following it, it is necessary to increase frequencies of C/A signals. Naturally, there has also been a demand for prices as low as possible upon constructing memory systems adaptive to high frequencies.

When considering the aspect of the low prices, the unbuffered memory module is advantageous in cost to the extent that a C/A register or buffer is not mounted on the memory module. Further, when the unbuffered memory module is adopted, it is not necessary to provide a region for mounting the C/A register or buffer therein, and thus the size of a module substrate can be reduced, thereby to excel in low height configuration.

On the other hand, if only the adaptation to the increasing frequencies of the C/A signals is considered, it is advantageous to employ the memory module with register as has been generally considered. In the memory system employing the unbuffered memory module, various problems that have not been expected may occur, such as a problem that when the frequency of a C/A signal is increased, a satisfactory waveform (i.e. waveform representing that a signal is inputted into respective memories simultaneously) can not be obtained.

Particularly, various standards are regulated with respect to the sizes of module substrates, meaning that a certain kind of limitation is imposed on the practicable module substrate sizes. This makes it difficult to adopt the equal-length wiring that is theoretically considered to be advantageous. Specifically, as a recent tendency, the number of memory devices mounted on one memory module has been increasing from various reasons, for example, for satisfying a demand for increasing the capacity of main memories following enlargement of program sizes of application software, and for increasing the data amount that can be handled at one time. However, as the number of the memory devices increases, it has been becoming difficult to realize a layout based on the equal-length wiring within a limited area. Particularly, it is difficult to ensure the balance of the wiring layout in a memory module with ECC (Error Check and Correct) function.

Suppressing unnecessary signal reflection using a terminating resistance or the like is effective means in view of waveform characteristics. On the other hand, there is also a demerit that the power consumption increases correspondingly to the electric power necessary for an operation of the terminating resistance or the like. For responding to various demands on the side of users, it is necessary to understand merits and demerits of them and offer various options.

SUMMARY OF THE INVENTION

It is therefore an object of the present invention to provide various options with respect to a memory system that employs an unbuffered memory module and has been improved to be adaptable to a high-frequency operation while maintaining an advantage of the unbuffered memory module.

As a result of carrying out a simulation and repeating consideration for solving the foregoing problems, the inventors of the present invention have found in the course thereof that, particularly in case of a memory module with ECC function, excellent waveform propagation can be achieved by employing a single T-branch topology as an internal C/A bus topology, rather than a dual T-branch topology. This means that from an aspect of wiring layout, a more simplified wiring layout can be employed.

Further, the inventors of the present invention have also found in the same simulation that excellent signal propagation can be achieved by keeping substantially constant the output impedance of a memory controller in the range of operating voltages of a C/A signal. For example, a MOS transistor is normally provided as an output transistor in an output stage of a memory controller and, if the MOS transistor is operated in a region other than a region (linear region in $V_D$-$I_D$ characteristic of MOS transistor) where the on-resistance of the MOS transistor becomes substantially constant, high-frequency C/A signal propagation is adversely affected. Based on this knowledge, means are taken to insert a resistor in series relative to an output end of the MOS transistor. When the whole memory controller is considered, the conclusion is that it is effective to maintain the output impedance of the memory controller substantially constant in the range of operating voltages of the C/A signal. Here, the range of operating voltages of the C/A signal represents a voltage range that is determined by the upper limit and the lower limit of the C/A signal level. For example, in the memory systems in recent years, it is 2.5V and, in the near future, it is expected to be 1.8V.

It is also concluded that it is effective to connect a capacitor to a signal bus connecting between the memory controller and the memory module for cutting high-frequency components of a C/A signal propagating on the signal bus. Specifically, by connecting one end of the capacitor to the signal bus and feeding the fixed potential (e.g. ground potential) to the other end thereof, noise in a broad sense can be reduced, thereby to achieve an excellent waveform characteristic.

Based on the foregoing simulation and consideration, the present invention provides an unbuffered memory system shown hereinbelow as means for solving the foregoing problems.

According to the present invention, there is obtained, as a first unbuffered memory system, an unbuffered memory system comprising an unbuffered memory module mounted thereon with a plurality of memory devices, a memory controller for sending the same command/address signal to all of the memory devices mounted on the memory module, and a signal bus connecting between the memory module and the memory controller to propagate the command/address signal from the memory controller to the memory module, wherein the memory module comprises a connector connected to the signal bus, and a module wiring connecting between the connector and the memory devices, and the module wiring has a one-step layer configuration comprising a first wiring portion extending from the connector to a branch point, and a second wiring portion deriving from the branch point and extending to reach the memory devices.

Further, according to the present invention, there is obtained, as a second unbuffered memory system, an unbuffered memory system according to the first unbuffered memory system, wherein the memory controller is configured such that when seeing the memory controller from a connection point between the signal bus and the memory controller, an output impedance with respect to the command/address signal is maintained substantially constant in an operating voltage range of the command/address signal.

Further, according to the present invention, there is obtained, as a third unbuffered memory system, an unbuffered memory system according to the second unbuffered memory system, wherein the memory controller comprises an output transistor and a resistance element inserted in series between an output end of the output transistor and the connection point, and a resistance value of the resistance element is selected taking into account an on-resistance value of the output transistor so as to satisfy a condition about the output impedance.

The concept of the foregoing unbuffered memory system resides in adjustment of the output impedance of the memory controller when seen from the side of the signal bus. Accordingly, when the designing condition and so on are taken into account, it is possible to arrange an impedance adjusting resistor outside the memory controller, or arrange resistors inside and outside the memory controller in a separated fashion.

Specifically, according to the present invention, there is obtained, as a fourth unbuffered memory system, an unbuffered memory system according to the first unbuffered memory system, wherein the memory controller comprises an output transistor, the unbuffered memory system further comprises a resistance element connected in series between the memory controller and the signal bus, and a resistance value of the resistance element is selected taking into account an on-resistance value of the output transistor such that when seeing the side of the memory controller from a connection point between the resistance element and the signal bus, an output impedance with respect to the command/address signal is maintained substantially constant in an operating voltage range of the command/address signal.

Further, according to the present invention, there is obtained, as a fifth unbuffered memory system, an unbuffered memory system according to the first unbuffered memory system, wherein the memory controller comprises an output terminal for outputting the command/address signal, an output transistor, and an internal resistance element inserted in series between an output end of the output transistor and the output terminal of the memory controller, the unbuffered memory system further comprises an external resistance element connected in series between the output terminal of the memory controller and the signal bus, and a total resistance value of the internal resistance element and the external resistance element is selected taking into account an on-resistance value of the output transistor such that when seeing the side of the memory controller from a connection point between the external resistance element and the signal bus, an output impedance with respect to the command/address signal is maintained substantially constant in an operating voltage range of the command/address signal.

The output impedance in each of the second to fifth unbuffered memory systems may take a value, for example, within the range of 25Ω±20%.

Further, according to the present invention, from the aspect of the foregoing noise countermeasure, there is obtained, as a sixth unbuffered memory system, an unbuffered memory system according to the first unbuffered memory system, further comprising a capacitance having a first and a second end, wherein the first end is connected to the signal bus, and a fixed potential is supplied to the second end.

In this sixth unbuffered memory system, the first end of the capacitor is preferably connected to the middle point of the signal bus in view of reduction in skew. The capacitance may take a value, for example, in the range of 20 pF to 40 pF.

The inventors of the present invention have found in the foregoing simulation that a transfer delay time of a C/A signal differs depending on the number of the memory devices mounted on the memory module. This is considered to be caused by the fact that the capacitive load as seen from the side of the memory controller differs depending on the number of the mounted memory devices.

In the memory system configured to be adapted to a certain number of the mounted devices, this difference in transfer delay time causes a problem that the proper setup margin/hold margin can not be secured in the memory devices. On the other hand, if a memory system is constituted per the number of the mounted devices, a memory controller etc. forming the memory system should be designed per type of the expected numbers of the mounted devices, which thus causes a problem of non-general, non-efficient and high cost. Particularly, when, for example, the memory module is used as a main memory in the computer system as described above, the memory controller (chipset) and the signal bus are fixed on the mother board, while the memory module is configured to be replaceable. Thus, there are those instances where the number of the mounted devices changes upon replacing the memory module. That is, there is a possibility that a propagation delay time of a C/A signal differs after shipment as the system or product. When considering such an event, it is necessary to dynamically adjust a delay time upon replacing the memory module. For enabling the dynamic delay time adjustment in the memory system taking into account such a situation, it is effective that the adjustment is carried out in the memory module itself, not in the signal bus that can not perform active operation, or that such a mechanism is incorporated in the memory controller that can perform active operation.

Based on the consideration described above, in order to absorb the difference in propagation delay time that may occur depending on the number of the mounted devices, the present invention adjusts the timing in which a C/A signal is outputted from the memory controller, or adjusts a time required for a C/A signal to reach the memory devices by adjusting the wiring lengths etc. on the signal bus.

Accordingly, the present invention further provides the following unbuffered memory systems.

Specifically, according to the present invention, there is obtained, as a seventh unbuffered memory system, an unbuffered memory system according to the first unbuffered memory system, wherein the memory controller comprises an output timing adjusting circuit for adjusting a timing of outputting the command/address signal, and the adjusted timing is variable and determined according to the number of the memory devices mounted on the memory module.

Further, according to the present invention, there is obtained, as an eighth unbuffered memory system, an unbuffered memory system according to the seventh unbuffered memory system, wherein the output timing adjusting circuit comprises a plurality of delay circuits corresponding to types of the expected mounted numbers of the memory devices, each of the delay circuits producing a delay corresponding to the mounted number of the memory devices, and the output timing adjusting circuit is configured such that when the mounted number of the memory devices is determined, one of the delay circuits is selectable.

Further, according to the present invention, there is obtained, as a ninth unbuffered memory system, an unbuffered memory system according to the seventh unbuffered memory system, wherein the memory controller operates based on an external clock signal supplied from the exterior, the output timing adjusting circuit comprises a DLL (Delay Locked Loop) circuit that receives the external clock signal and produces an internal clock signal by adjusting a delay amount, a latch circuit for latching a command/address signal for a predetermined time according to the internal clock signal, an internal delay replica connected to the DLL circuit and showing a delay time from the internal clock signal to outputting of the command/address signal corresponding to the internal clock signal, and a plurality of delay circuits connected to the internal delay replica and the DLL circuit, and operating as an external delay replica for determining the predetermined time in the latch circuit, and the plurality of delay circuits produce delays corresponding to the expected mounted numbers of the memory devices, respectively, and are configured such that when the mounted number of the memory devices is determined, one of the delay circuits is selectable.

Further, according to the present invention, with respect to the foregoing adjustment of the wiring lengths and so on, there is obtained, as a tenth unbuffered memory system, an unbuffered memory system according to the first unbuffered memory system, wherein, depending on the number of the memory devices mounted on the memory module, wiring lengths of the first wiring portion and the second wiring portion of the module wiring are determined, and/or an additional capacitance is connected to the module wiring.

As a result of repeating further simulations and consideration based thereon, the inventors of the present invention have recognized that overshoot occurs when the number of the mounted devices is relatively small, such as 4 to 9, and found that, for solving it, it is effective to provide a terminating resistor on the memory module or dispose active termination means in the memory devices, or insert an impedance between the branch point and the connector in the single T-branch topology without using the termination means such as the terminating resistor or active termination means.

Therefore, based on the foregoing consideration, the present invention provides the following unbuffered memory systems.

Specifically, according to the present invention, there is obtained, as an eleventh unbuffered memory system, an unbuffered memory system according to the first unbuffered memory system, wherein when the number of the memory devices mounted on the memory module is within a predetermined range, the memory module further comprises a terminating resistance added to the second wiring portion, and the terminating resistance has a resistance value equal to or greater than an effective impedance of the module wiring.

Further, according to the present invention, there is obtained, as a twelfth unbuffered memory system, an unbuffered memory system according to the first unbuffered memory system, wherein when the number of the memory devices mounted on the memory module is 4 or 5, the memory module further comprises a resistance element inserted in series in the first wiring portion, and a resistance value of the resistance element is within a range of $25\Omega \pm 20\%$.

Further, according to the present invention, there is obtained, as a thirteenth unbuffered memory system, an unbuffered memory system according to the first unbuffered memory system, wherein when the number of the memory devices mounted on the memory module is 8 or 9, the memory module further comprises a resistance element inserted in series in the first wiring portion, and a resistance value of the resistance element is within a range of $10\Omega \pm 20\%$.

Further, according to the present invention, there is obtained, as a fourteenth unbuffered memory system, an unbuffered memory system according to the first unbuffered memory system, wherein each of the memory devices mounted on the memory module comprises active termination means and an active termination terminal connected to the active termination means, and it is designed that when the number of the memory devices mounted on the memory module is within a predetermined range, the active termination means provided in a predetermined number of the memory devices among all the memory devices function.

Further, according to the present invention, there is obtained, as a fifteenth unbuffered memory system, an unbuffered memory system according to the fourteenth unbuffered memory system, wherein the number of the memory devices mounted on the memory module is 9, two memory devices among the memory devices are designed such that the active termination means thereof function, and the active termination terminals of the memory devices other than the two memory devices designed that the active termination means thereof function, are grounded.

In the foregoing unbuffered memory systems, the memory devices may be disposed evenly or unevenly on right and left sides with respect to the branch point on the module wiring. For example, if the number of the mounted memory devices is one of 4, 8 and 16, the memory devices may be arranged evenly, while, if the number of the mounted memory devices is one of 5, 9 and 18, the memory devices may be arranged unevenly. The configuration of each of the foregoing unbuffered memory systems significantly contributes to excellent waveform characteristics particularly when the operating frequency of a C/A signal exceeds 100 MHz, but may be operated at the frequencies equal to or below 100 MHz. In the foregoing unbuffered memory systems, the wiring impedance of the module wiring is preferably within the range of 50Ω to 65Ω.

BRIEF DESCRIPTION OF THE DRAWINGS

FIG. 7 is a diagram for explaining the output impedance of the chipset and, in particular, a diagram when an nMOS transistor of a CMOS inverter forming an output stage of the chipset is turned on;

FIG. 8 is a diagram for explaining the output impedance of the chipset and, in particular, a diagram when a pMOS transistor of a CMOS inverter forming an output stage of the chipset is turned on;

DESCRIPTION OF THE PREFERRED EMBODIMENT

Now, memory systems according to preferred embodiments of the present invention will be described in detail with reference to the drawings. Each of the memory systems described hereinbelow operates with reference clocks in the range of 200 to 400 MHz and with command/address signals in the range of 100 to 200 MHz. However, the concept of the present invention is also applicable to other frequencies. A memory module forming the memory system is of the type mounted with DRAM devices as memory devices, but it is not intended to exclude applicability to other memory modules. Further, resistance values and so on that are used herein are typical values, and variation of approximately ±20% is included if mass productivity is taken into account.

First Embodiment

Figure 1:
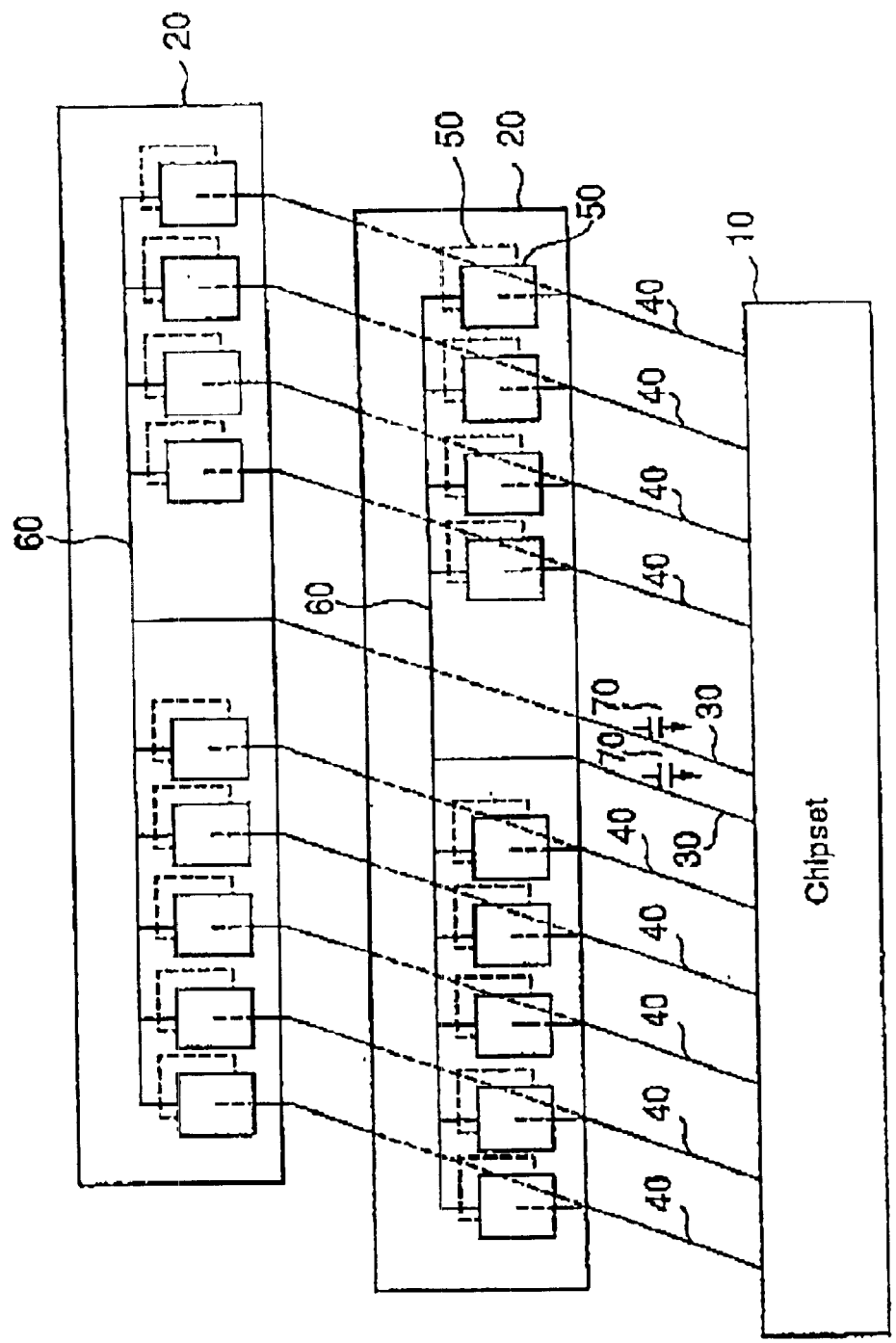
FIG. 1 is a diagram showing the conceptual overall configuration of a memory system according to a first embodiment of the present invention.

As shown in FIG. 1, a memory system according to the first embodiment of the present invention comprises a chipset 10, memory modules 20, C/A buses 30 and CLK buses 40. On each of the memory modules 20 in this embodiment, a total of 18 DRAM devices 50 are mounted, with 9 DRAM devices 50 on each side thereof. The DRAM devices 50 all have the same characteristics, and the memory module 20 is assumed to have an ECC function.

Inasmuch as FIG. 1 conceptually shows the memory system according to this embodiment, a mother board is omitted. In the actual system, however, the chipset 10 is mounted on a mother board, and the C/A buses 30 and the CLK buses 40 are also disposed on the mother board. A capacitor 70 is connected to each C/A bus 30. Further, sockets are provided on the mother board and, by inserting a connector, which will be described later, of the memory module 20 into each of the sockets, the memory system shown in FIG. 1 is constituted. Specifically, by the insertion of the memory module 20 into the socket, the C/A bus 30 is connected to an internal C/A bus 60 formed on a module substrate, thereby to transfer C/A signals outputted from the chipset 10 to the DRAM devices 50 mounted on the memory module 20. The CLK buses 40 transfer clock signals outputted from the chipset 10 to the corresponding DRAM devices 50. On the other hand, for example, in a computer system employing the present memory system, if a clock generator for producing reference clocks is separately provided, the reference clocks are inputted into the chipset 10 from such a clock generator, and clock signals and C/A signals are outputted from the chipset 10 in accordance therewith.

As clear from FIG. 1, in this embodiment, the C/A bus 30 is provided for each memory module 20, while the number of the CLK buses 40 provided is 9 (=18 (total device number/1 module)/2 (two sides of module)), and each CLK bus 40 is shared between the corresponding DRAM devices 50 of the respective memory modules 20. For simplifying the figure, the C/A bus 30 is drawn as one line for each memory module 20. However, the C/A bus 30 is actually in the form of a bunch of signal lines corresponding to the total number of command signals and address signals to be transferred.

Figure 2:
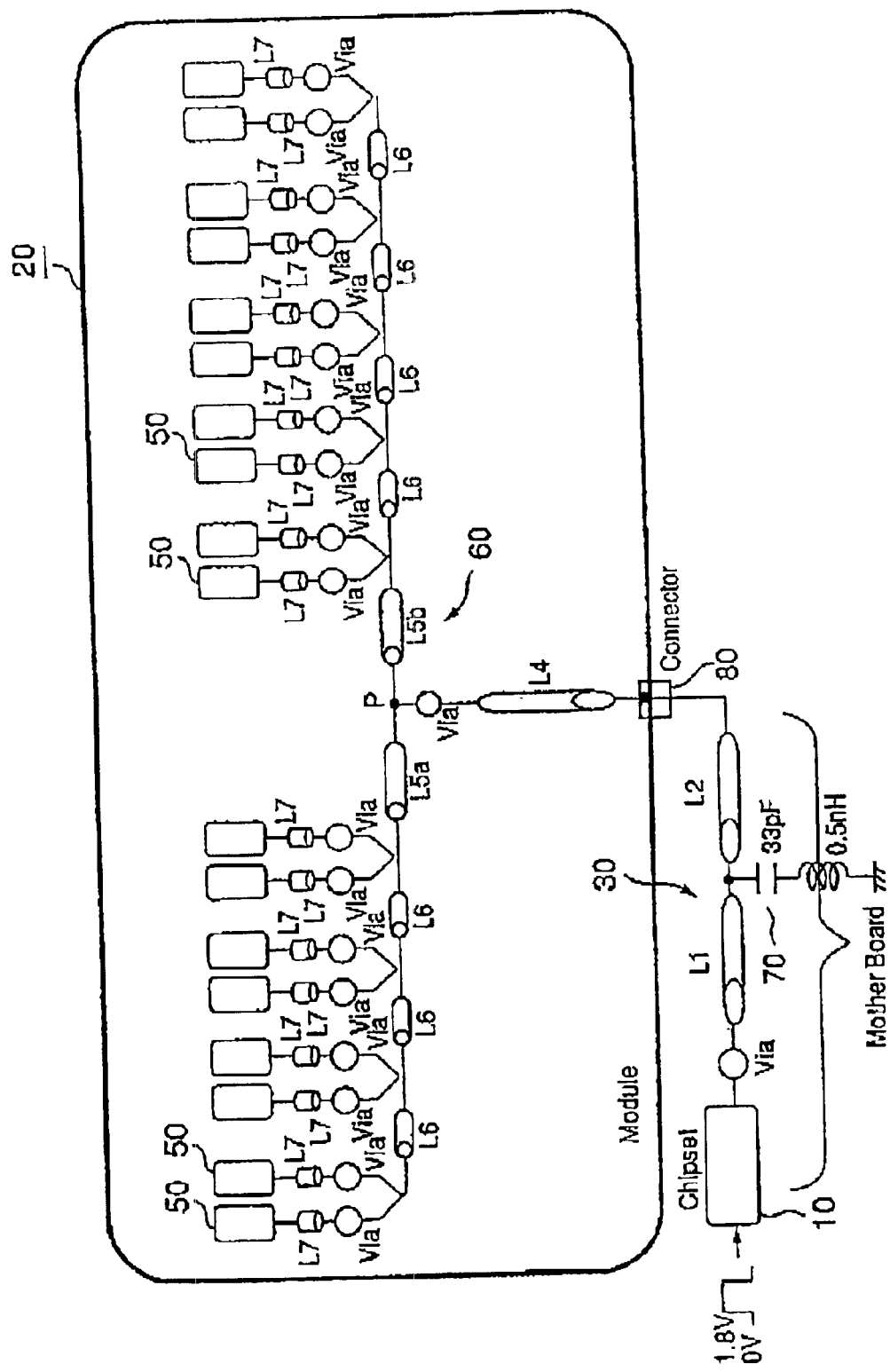
FIG. 2 is a diagram showing the memory system of FIG. 1 by paying attention to one memory module.

For explaining the configuration of the memory system shown in FIG. 1 in further detail, FIG. 2 is prepared by paying attention to one of the memory modules 20 and the C/A bus 30 connected thereto. It is to be noted that although the memory system is further provided with data buses (DQ buses) and so on in addition to the CLK buses and the C/A buses shown in FIGS. 1 and 2, those are not directly related to the present invention and thus are omitted in the drawings.

In FIG. 2, the chipset 10 is connected to the C/A bus 30 (L1, L2) through a via hole, and the C/A bus 30 is connected to the internal C/A bus 60 via a connector 80 provided at one end of the memory module 20. Wiring lengths represented by L1 and L2 in the C/A bus 30 are set to 31.75 mm, respectively, and therefore, the capacitor 70 is connected to a position corresponding to the middle point of the C/A bus 30.

In this embodiment, the capacitor 70 has a capacitance value of 33 pF, and mainly serves to cut high-frequency components of C/A signals, and in addition, influences a propagation delay time of C/A signals. However, as is clear, for example, from the fact that the capacitor 70 is commonly used even if the memory module is replaced, the influence of the capacitor 70 onto the propagation delay time of C/A signals may not be taken into account from a theoretical point of view when considering a difference in propagation delay time that is caused by a change in the number of the mounted devices. A technique for directly solving the problem following the change in the number of the mounted devices will be described using FIGS. 6, 9, 10, 11, 12, 13 and so on.

If the capacitor 70 is dislocated from the middle point of the C/A bus, the waveform is deteriorated to increase variation. Accordingly, it is desirable that the capacitor 70 be connected to the middle point of the C/A bus 30 as exemplified in this embodiment. In FIG. 2, a reactance of 0.5 nH is connected to the capacitor 70. However, this is a parasitic reactance and, actually, the capacitor 70 is connected to the middle point of the C/A bus 30 at one end thereof and grounded to the mother board at the other end thereof. Instead of such a connecting relationship, the other end of the capacitor 70 may be connected to a terminal such as VDD that supplies another fixed potential.

Figure 3:
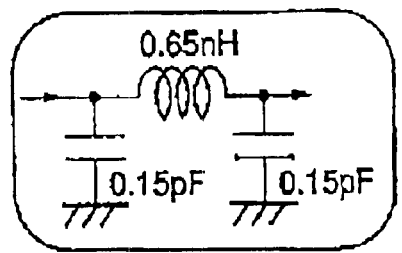
FIG. 3 is a diagram showing a schematic equivalent circuit of a via hole (Via) shown in FIG. 2.

As apparent from FIGS. 1 and 2, in this embodiment, the memory module 20 is of an unbuffered type with no C/A register or buffer, and the topology of the internal C/A bus 60 is a single T-branch topology. Specifically, the internal C/A bus 60 has a one-step layer wiring topology composed of a first wiring portion (L4, Via) connecting between the connector 80 and a branch point P, and a second wiring portion (L5a, L5b, L6, L7, Via) deriving from the branch point P and extending to reach the respective DRAM devices 50. Symbol Via shown in FIG. 2 represents a via hole that can be schematically illustrated as an equivalent circuit as shown in FIG. 3. In this embodiment, wirings L4, L5a, L5b, L6 and L7 have wiring lengths of 30.0 mm, 12.5 mm, 12.5 mm, 12.0 mm and 1.0 mm, respectively, and the wiring impedance is 63Ω. In this embodiment, an inductance L per unit length and a capacitance C per unit length that determine a wiring impedance $\sqrt{(L/C)}$ are 3.78E-07H/m and 9.5238E-11F/m, respectively, which are values selected in view of a propagation delay time tPD=6 ns/m.

Figure 4:
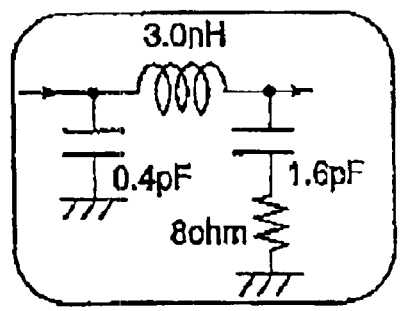
FIG. 4 is a diagram showing a schematic equivalent circuit of an input portion of a DRAM device shown in FIG. 2.
Figure 5:
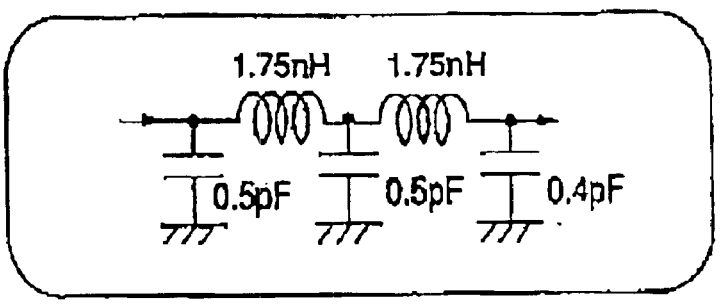
FIG. 5 is a diagram showing a schematic equivalent circuit of a connector shown in FIG. 2.

In FIG. 2, when seeing the side of the DRAM devices 50 from the side of the chipset 10, each DRAM device is seen as a capacitive load. Specifically, each DRAM device 50 has a capacitance value (approximately 2.0 pF) as represented by an equivalent circuit shown in FIG. 4. A schematic equivalent circuit of the connector 80 is shown in FIG. 5.

Figure 6:
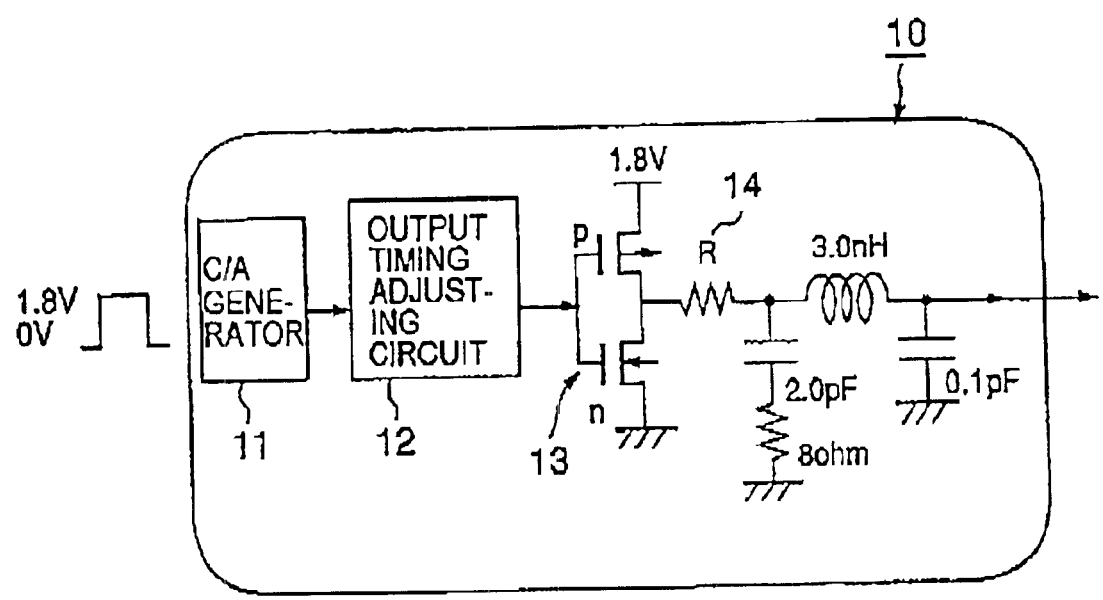
FIG. 6 is a diagram showing a schematic configuration of a chipset shown in FIGS. 1 and 2.

FIG. 6 is a schematic diagram of the chipset 10 according to this embodiment. For simplification, FIG. 6 only shows a stage subsequent to a C/A generator 11 that produces command/address signals. Actually, the C/A generator 11 comprises a command generating section and an address generating section. However, the present invention does not relate to the contents themselves of command signals or address signals, but directly relates to signal lines or buses, and thus, the command generating section and the address generating section are conceptually put together to form the C/A generator 11.

In FIG. 6, an output timing adjusting circuit 12, a CMOS inverter 13, and a resistor 14 having a resistance value R and connected in series to an output end of the CMOS inverter 13 are provided in the stage subsequent to the C/A generator 11. Actually, the C/A generator 11, the output timing adjusting circuit 12, the CMOS inverter 13 and so on are not necessarily connected directly to each other as shown in the figure, and therefore, other constituent elements not shown may be interposed therebetween.

Each of an nMOS transistor and a pMOS transistor constituting the shown CMOS inverter 13 is of a size having a characteristic that the on-resistance in a linear region is 5Ω. An 8Ω resistor, a 2.0 pF capacitor, a 0.1 pF capacitor and a 3.0 nH inductor shown in a stage subsequent to the resistor 14 form an equivalent circuit representing a parasitic impedance etc. of a package etc. from the resistor 14 to a connection point between the chipset 10 and the C/A bus 30.

In this embodiment, the resistance value R of the resistor 14 is determined such that the output impedance on the side of the chipset 10, when seeing the side of the chipset 10 from the connection point between the chipset 10 and the C/A bus 30, becomes constant in the range of operating voltages of a C/A signal. In other words, in this embodiment, the resistance value R of the resistor 14 is determined such that the current-voltage characteristic at an input end of the C/A bus 30 becomes linear.

Figure 7:
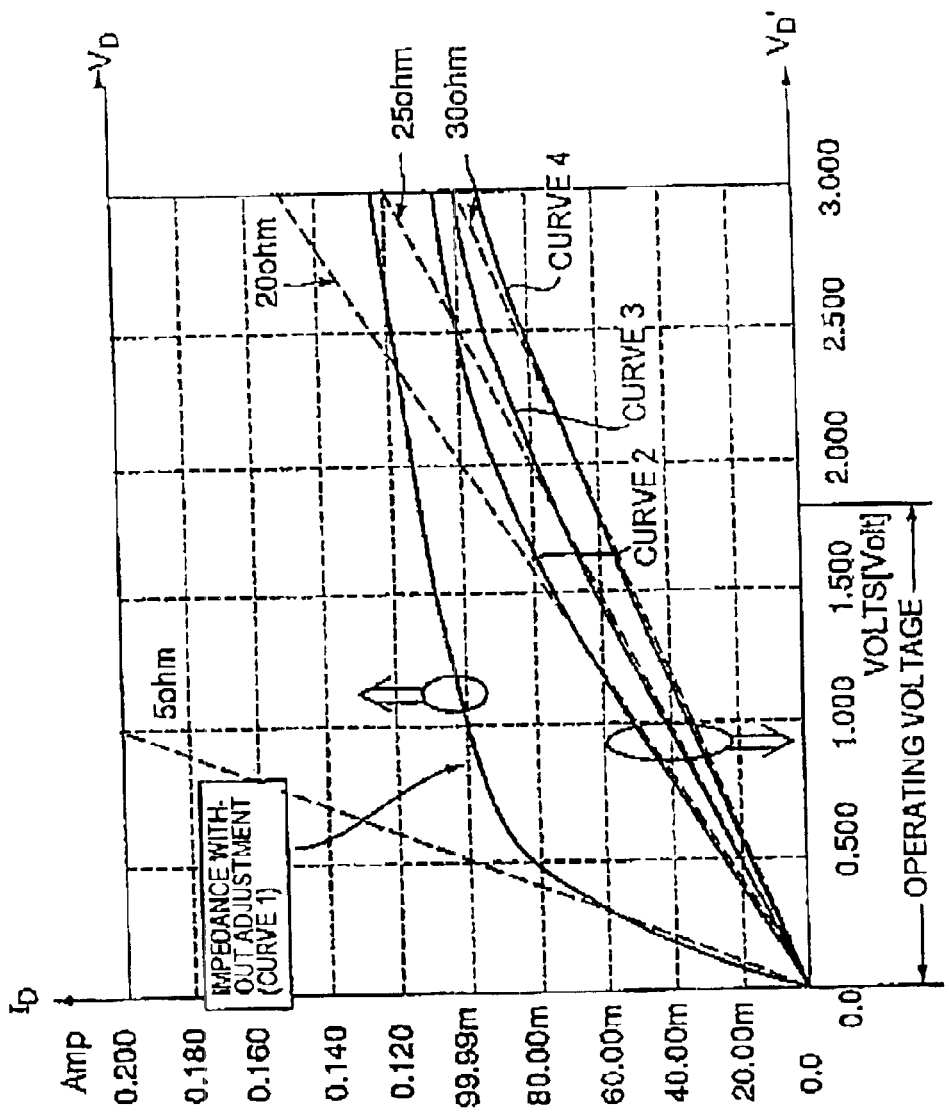
Figure 8:
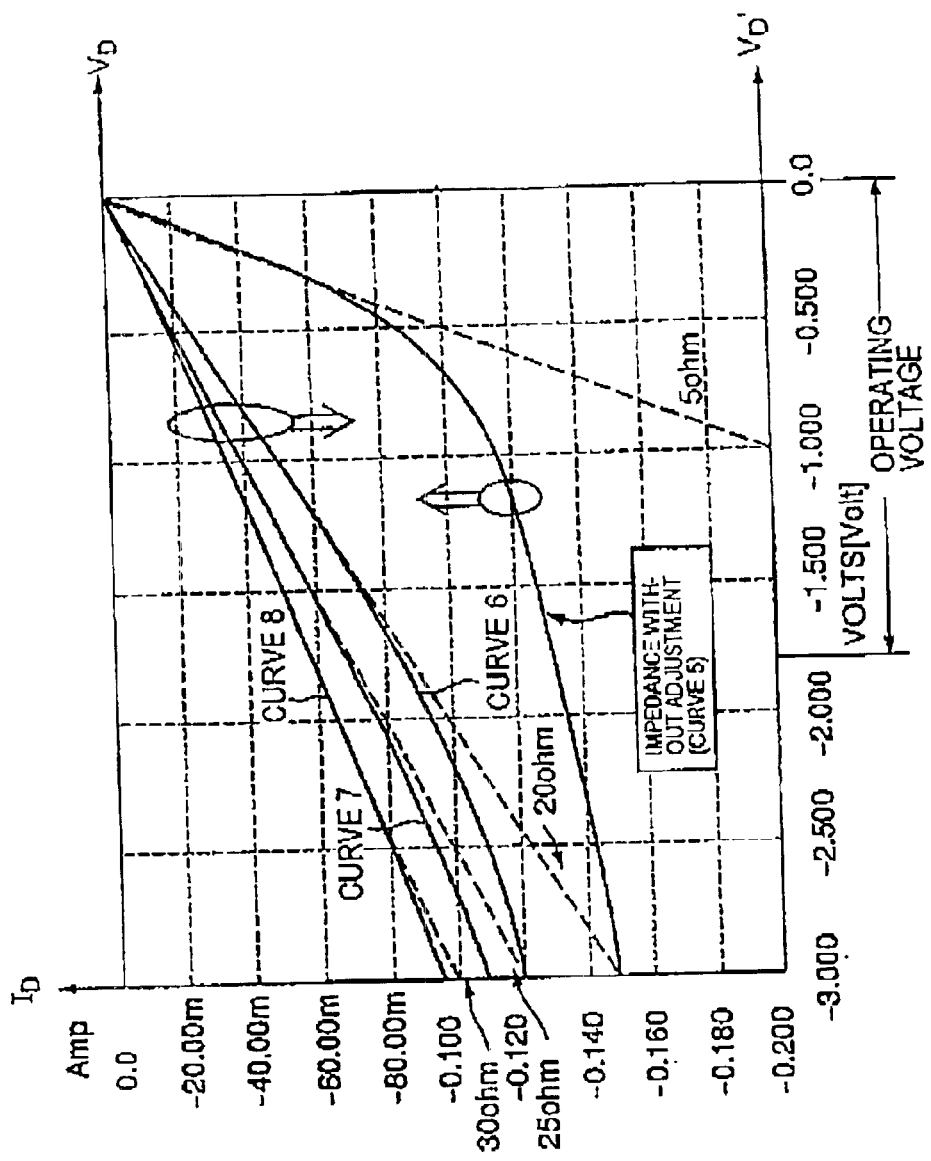

Now, a relationship between the output impedance of the chipset 10 and the resistance value R of the resistor 14 will be described with reference to FIGS. 7 and 8. FIG. 7 relates to the nMOS transistor of the CMOS inverter 13 forming the output stage of the chipset 10, while FIG. 8 relates to the pMOS transistor of the CMOS inverter 13. In FIGS. 7 and 8, $I_D$ and $V_D$ represent drain current and drain voltage, respectively, in the nMOS transistor and the pMOS transistor, and curve 1 in FIG. 7 and curve 5 in FIG. 8 represent $I_D$-$V_D$ characteristics, respectively. In other words, curve 1 in FIG. 7 and curve 5 in FIG. 8 represent the $I_D$-$V_D$ characteristics without impedance adjustment according to this embodiment. On the other hand, $V_D'$ in FIGS. 7 and 8 represents voltage at an input side end point of the C/A bus 30 (i.e. connection point between the chipset 10 and the C/A bus 30), and curves 2 to 4 in FIG. 7 and curves 6 to 8 in FIG. 8 represent $I_D$-$V_D'$ characteristics, respectively. In other words, curves 2 to 4 in FIG. 7 and curves 6 to 8 in FIG. 8 represent the $I_D$-$V_D'$ characteristics that have been subjected to the impedance adjustment.

In general, the $I_D$-$V_D$ characteristic of the MOS transistor is composed of a resistance region (linear region) and a saturation region (pinchoff region). Ideally, the drain current $I_D$ in the saturation region becomes constant regardless of the drain voltage $V_D$. That is, the on-resistance of the transistor varies depending on the drain voltage $V_D$. For example, in the $I_D$-$V_D$ characteristics designated by curve 1 and curve 5 in FIGS. 7 and 8, the range of approximately 0 to ±0.3V represents a linear region, and a subsequent region where the drain current $I_D$ changes only moderately relative to a change in drain voltage $V_D$ represents a saturation region. The on-resistance (resistance value upon operation of MOS transistor in linear region) of the shown nMOS and pMOS transistors is 5Ω.

On the other hand, the operating voltage range of the C/A bus 30 in this embodiment, i.e. the amplitude of a C/A signal, is in the range of 0 to 1.8V. As clear from curve 1 and curve 5 in FIGS. 7 and 8, the operating voltage range can not be dealt with only by the linear region and extends over the saturation region in either of the nMOS and pMOS transistors.

In this embodiment, assuming that the change of the on-resistance is one of causes that prevent the formation of a satisfactory waveform upon high-frequency operation, the on-resistance of the output transistor is considered so that the resistor 14 with a resistance value that has been selected to keep substantially constant the output impedance of the chipset 10 is connected in series to the output end of the output transistor. Specifically, in this embodiment, considering that the on-resistance of the nMOS or pMOS transistor is 5Ω as noted above, the resistance value R of the resistor 14 is set to 20Ω so as to be adapted to curve 3 and curve 7 in FIGS. 7 and 8 (i.e. so that the output impedance of the chipset 10 becomes 25Ω). It is to be noted that inasmuch as the resistor 14 mainly aims to keep constant the output impedance, for example, if curve 4 and curve 8 in FIGS. 7 and 8 are selected (i.e. the output impedance of the chipset 10 is to be set to 30Ω) while the on-resistance of the nMOS or pMOS transistor is 5Ω, the resistance value R may be set to 25Ω and, if curve 3 and curve 7 in FIGS. 7 and 8 are selected (i.e. the output impedance of the chipset 10 is to be set to 25Ω) while the on-resistance of the nMOS or pMOS transistor is 3Ω, the resistance value R may be set to 22Ω. Specifically, to summarize the general method of determining the resistance value R, (1) selecting a case where the output impedance of the chipset 10 becomes substantially constant, from, for example, the $I_D$-$V_D'$ characteristics shown in FIGS. 7 and 8 (e.g. selecting the $I_D$-$V_D'$ characteristics represented by curve 3 and curve 7: setting the output impedance in this case as Ron), and (2) determining the resistance value R of the resistor 14 by subtracting the on-resistance of the output transistor of the chipset from the selected output impedance Ron. It is possible to carry out the impedance adjustment using an element other than the resistor 14. However, inasmuch as the adjustment is easy and the reliability is high, it is desirable to use the resistor 14 as in this embodiment.

With the foregoing arrangement, the possible maximum or minimum value of the drain voltage $V_D$ of the nMOS or pMOS transistor becomes a potential dropped or increased by the resistor 14, respectively, and the voltage range thereof is included in the linear region in view of the $I_D$-$V_D$ characteristic of the nMOS or pMOS transistor. On the other hand, as clear from, for example, curve 3 and curve 7 in FIGS. 7 and 8, with respect to the potential $V_D'$ at the connection point between the chipset 10 and the C/A bus 30, which is seen as pseudo drain voltage when observing the chipset 10 from the output side, the operating voltage range of the C/A bus is included in the linear region of the $I_D$-$V_D'$ characteristic.

The resistor 14 is incorporated in the chipset 10, but may be disposed outside the chipset 10, i.e. inserted in series between the chipset 10 and the C/A bus 30. Also in this case, how to determine the resistance value R is the same as the foregoing method except that $VD_D'$ to be considered thereupon is not the potential at the output end of the chipset 10, but the potential at a connection point between the resistor disposed outside the chipset 10 and the C/A bus 30. Similarly, the resistor 14 may be divided into a resistor provided inside the chipset 10 (an internal resistor element) and another resistor provided outside the chipset 10 (an external resistor element). In this case, how to determine the total resistance value of the internal resistor element and the external resistor element is the same as the foregoing method of determining the resistance value R of the resistor 14 except that $V_D'$ to be considered thereupon is not the potential at the output end of the chipset 10, but the potential at a connection point between the external resistor element and the C/A bus 30.

As described above, in case of the memory module 20 of the unbuffered type employing the single T-branch topology as the internal bus topology, the DRAM devices 50 are recognized from the chipset 10 as the large load capacitance corresponding to the number of the mounted DRAM devices. In other words, as will be shown in later-described other embodiments, this load capacitance is reduced as the number of the mounted DRAM devices 50 is decreased. Such a change in the load capacitance results in causing different delay times with respect to transfer of a C/A signal from the chipset 10 to the DRAM devices 50 if no measures are taken.

In general, in the normal using manner of the computer system, once mounted on the mother board, the chipset 10 is not replaced thereafter, while the memory module 20 is expanded or replaced. Thereupon, the number of the DRAM devices 50 mounted on the memory module 20 often changes. Accordingly, if the chipset 10 is set up to correspond to a particular number among the expected numbers of the DRAM devices 50 to be mounted, the setup margin/hold margin can not be secured on the side of the DRAM devices 50 due to differences in transfer delay time of a C/A signal corresponding to the number of the mounted devices in some cases. Moreover, it is possible that such a situation becomes significant when the path of a C/A signal to the DRAM device 50 (C/A bus+internal C/A bus) and the path of a clock signal thereto (CLK bus) differ from each other. For example, in the memory system according to this embodiment, if no measures are taken with respect to the change in load capacitance corresponding to the number of the mounted devices, a C/A signal propagation delay time is approximately 2.8 ns when the mounted device number is 18, while it is approximately 2.5 ns when the mounted device number is 9, and it is approximately 2.0 ns when the mounted device number is 5.

Figure 9:
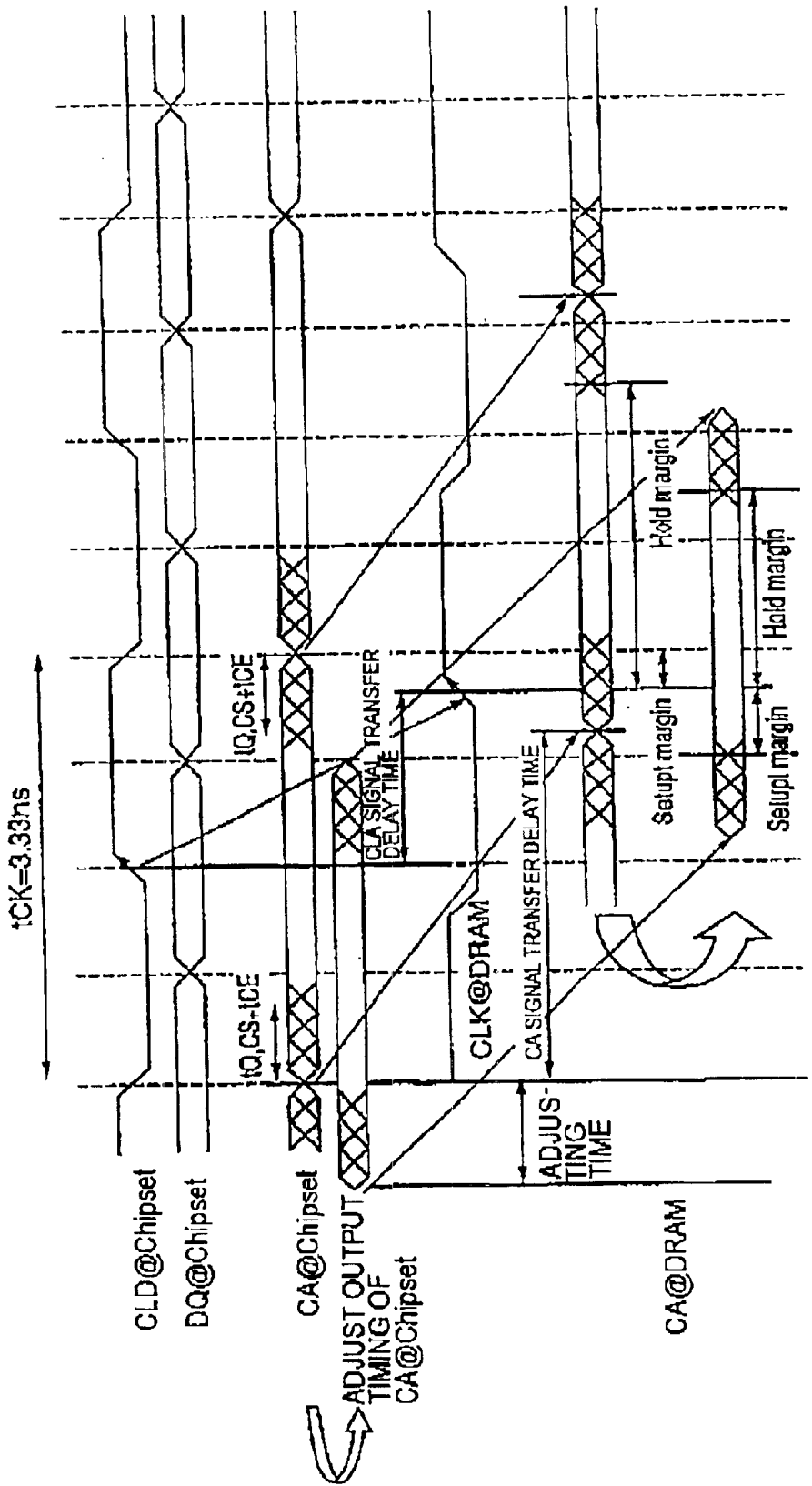
FIG. 9 is a timing chart for explaining an operation of an output timing adjusting circuit shown in FIG. 6.

FIG. 9 is a diagram for explaining such a problem of the C/A signal propagation delay time and the method of solving it. In FIG. 9, a time from rising of a clock shown at CLK@Chipset to corresponding rising of a clock shown at CLK@DRAM represents a propagation delay time of a clock signal. On the other hand, a difference between a signal sequence on the upper side at CA@Chipset and a signal sequence on the lower side at CA@DRAM represents a propagation delay time of a C/A signal. As clear from FIG. 9, there is a slight difference between the propagation delay time of the clock signal and the propagation delay time of the C/A signal due to a difference in signal transfer path. Thus, if a proper adjustment of output timing of the C/A signal corresponding to the mounted device number is not performed, the setup margin/hold margin of the C/A signal can not be secured on the side of the DRAM devices 50.

Therefore, in order to properly cope with the C/A signal transfer delay time that changes depending on the mounted device number, the output timing adjusting circuit 12 is provided between the C/A generator 11 and the CMOS inverter 13 in the chipset 10 according to this embodiment, as shown in FIG. 6. The output timing adjusting circuit 12 selectably retains a plurality of adjusting times determined in advance correspondingly to the mounted device number, and advances or retards a C/A signal outputted from the C/A generator by a corresponding adjusting time at a time instant when the mounted device number is confirmed. The output timing adjusting circuit 12 comprises a DLL (Delay Locked Loop) circuit, delay circuits and so on. Referring again to FIG. 9, there is shown an example where the output timing adjusting circuit 12 having the DLL circuit moves up the output timing of the C/A signal by an adjusting time corresponding to the mounted device number so that the setup margin/hold margin of the C/A signal is secured on the side of the DRAM device 50. Since an adjustng time corresponds to the foregoing C/A signal transfer delay time, it is longer as the mounted device number is larger in case the adjusting time advances the output timing, while it is longer as the mounted device number is smaller in case the adjusting time retards the output timing.

Figure 10:
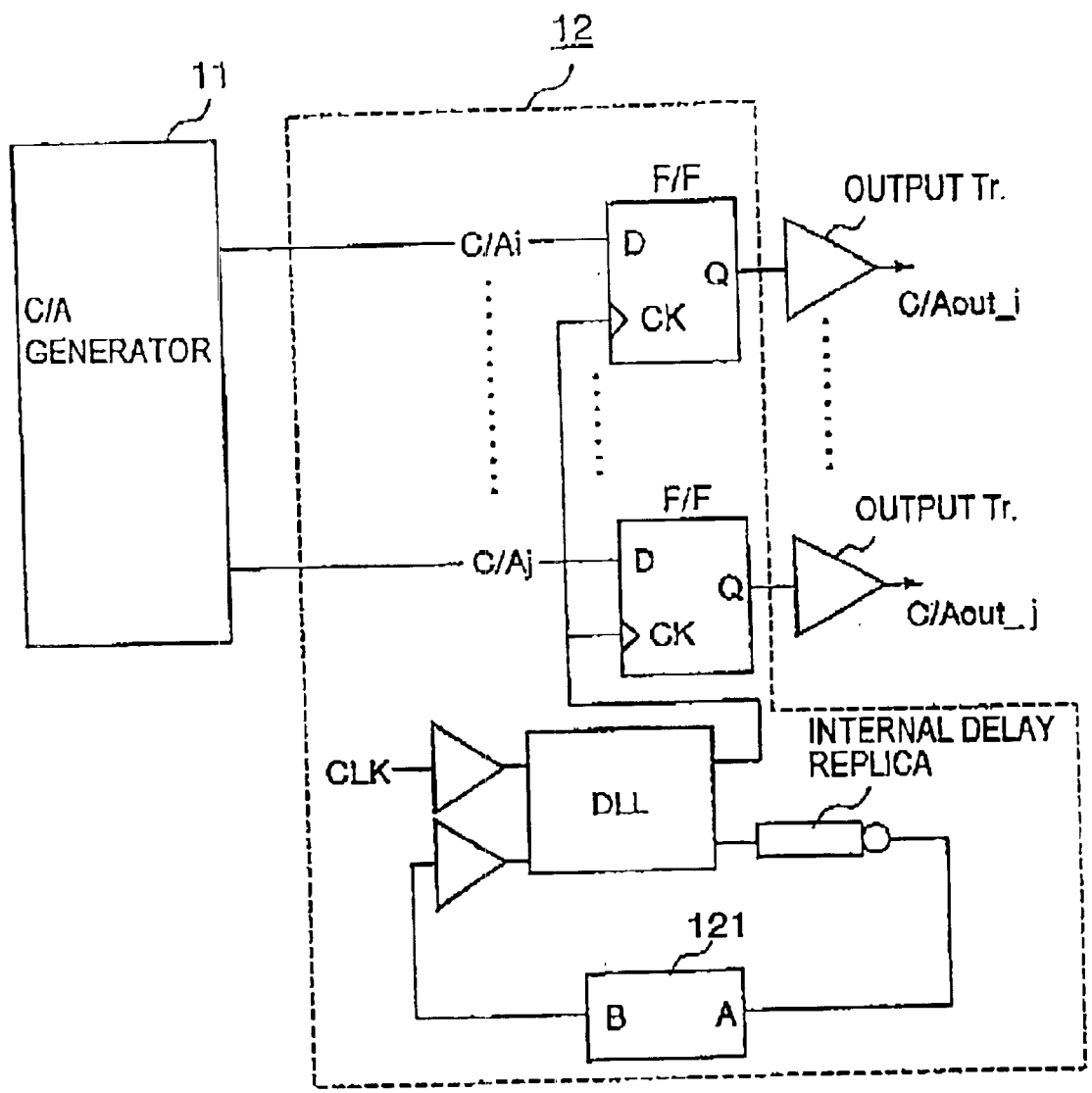
FIG. 10 is a diagram showing one example of a concrete configuration of the output timing adjusting circuit shown in FIG. 6.

FIG. 10 shows one example of the output timing adjusting circuit 12. The shown output timing adjusting circuit 12 comprises a DLL circuit that receives a clock signal CLK for operation of the chipset 10 from the exterior and moves up the clock signal CLK by a delay time according to an internal delay replica and an external delay replica 121 so as to produce an internal clock signal, and flip-flops (F/F) that performs latch operations according to an internal clock signal provided per command signal/address signal C/Ai . . . C/Ai. Each flip-flop comprises an input D, an output O, and a clock input CK. An output transistor (Output Tr.) shown in FIG. 10 corresponds to the CMOS inverter 13 shown in FIG. 6. Inasmuch as the nMOS transistor and the pMOS transistor of the CMOS inverter 13 do not turn on simultaneously, it is simply shown as the output transistor. Output signals C/Aout i . . . C/Aout i are output from an output transistor for each respective command signal/address signal C/Ai . . . C/Ai.

Of the shown two delay replicas, the internal delay replica shows a delay time from outputting of an internal clock signal by the DLL circuit to sending out (outputting) of a C/A signal corresponding to such an internal clock signal from the output transistor, and the external delay replica 121 retains delay times switchable correspondingly to the mounted device number.

Figure 11:
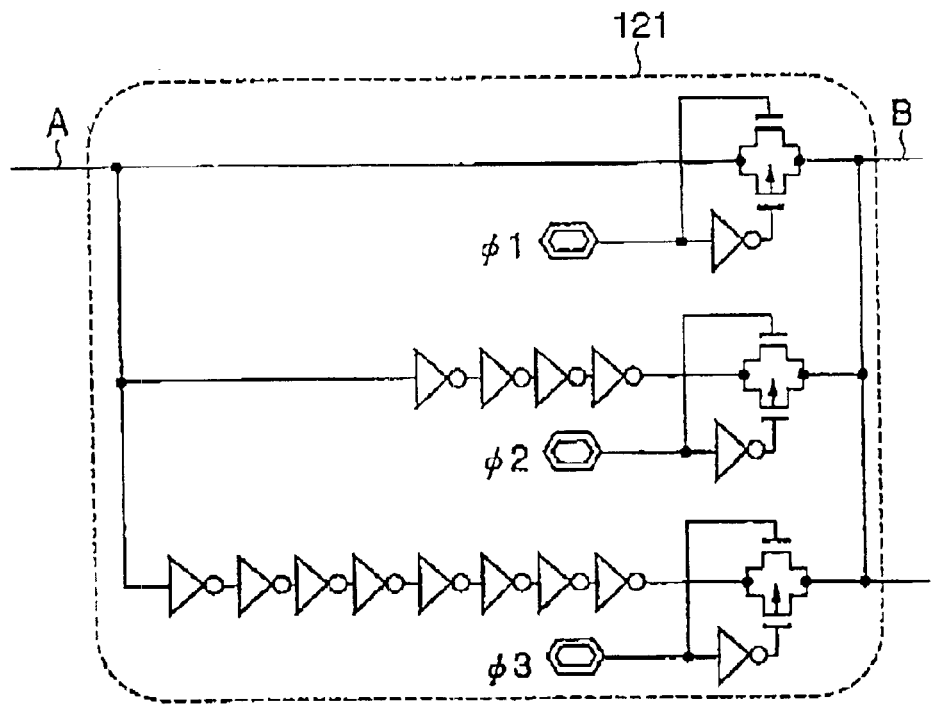
FIG. 11 is a diagram showing one example of a concrete configuration of an external delay replica in the output timing adjusting circuit shown in FIG. 10.

Referring to FIG. 11, there is shown an example of a configuration of the external delay replica 121. Since the right and left sides are inverted between FIGS. 10 and 11, symbols A and B are assigned to two ends of the external delay replica 121.

The external delay replica 121 shown in FIG. 11 has a circuit configuration wherein, with respect to delay times, three different circuits are connected in parallel to each other. Specifically, from the upper side in FIG. 11, a circuit with a delay time of 0, a circuit with a delay time corresponding to 4 inverters, and a circuit with a delay time corresponding to 8 inverters are connected in parallel to each other. Among them, the circuit with the delay time of 0 corresponds to a module with 4 devices mounted thereon, the circuit with the delay time corresponding to 4 inverters corresponds to a module with 9 devices mounted thereon, and the circuit with the delay time corresponding to 8 inverters corresponds to a module with 18 devices mounted thereon. These mutually parallelly connected circuits operate only when high-level signals are inputted to corresponding selection terminals ø1, ø2 and ø3, respectively. Therefore, for example, upon starting up the computer system, when recognition of the memory capacity is performed to derive the mounted device number, a high-level signal is inputted to corresponding one of the selection terminals ø1, ø2 and ø3, and a low-level signal is inputted to the other selection terminals, so that a C/A signal can be transferred to the corresponding DRAM devices 50 at the output timing adjusted by a proper adjusting time in subsequent processing. When the mounted device number is fixed or known, only corresponding one of the selection terminals ø1, ø2 and ø3 may be open-circuited, and the other terminals may be grounded, or manual setting by jumper pins may be adopted FIGS. 12 and 13 show one example of an output timing adjusting circuit 12 mainly constituted only by delay circuits, which differs from the output timing adjusting circuit shown in FIGS. 10 and 11.

Figure 12:
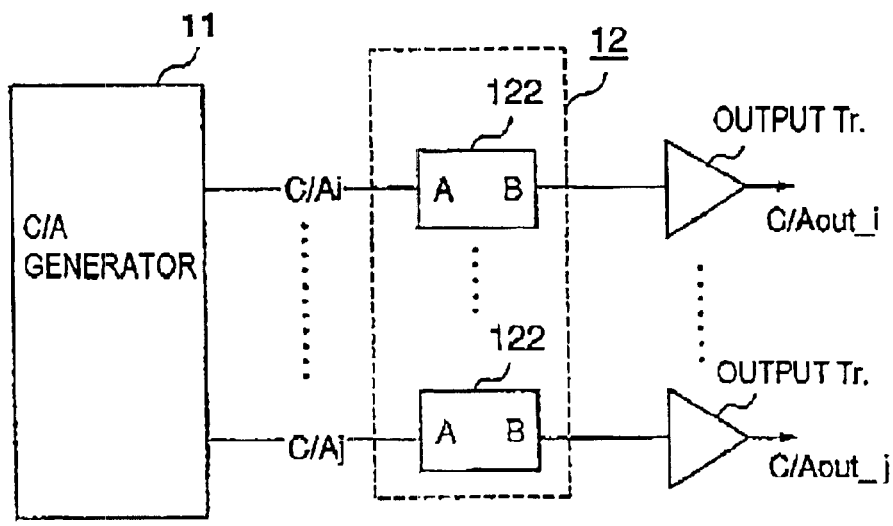
FIG. 12 is a diagram showing another example of a concrete configuration of the output timing adjusting circuit shown in FIG. 6.
Figure 13:
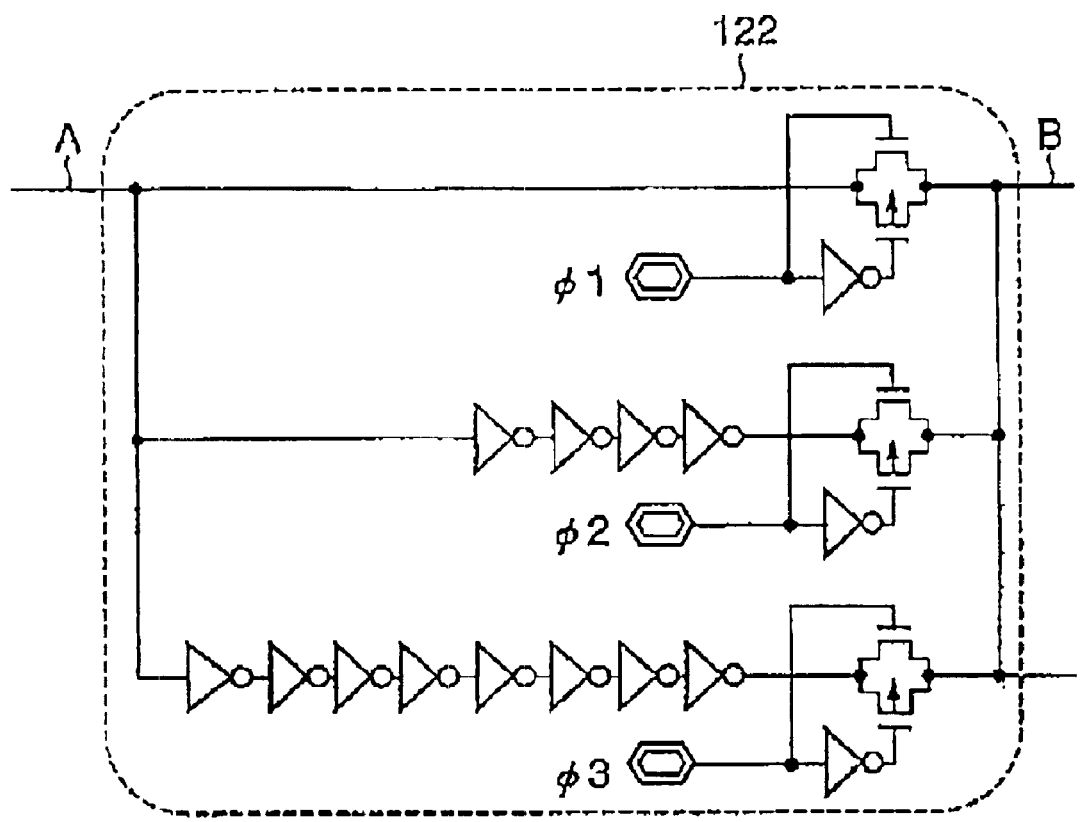
FIG. 13 is a diagram showing one example of a concrete configuration of a delay circuit in the output timing adjusting circuit shown in FIG. 12.

The output timing adjusting circuit 12 shown in FIG. 12 comprises a delay circuit 122 provided per command signal/address signal. As shown in FIG. 13, each of the delay circuits 122 has the same circuit configuration as that of the external delay replica 121 shown in FIG. 11.

Specifically,with respect to delay times, three different circuits are connected in parallel to each other. However, although the foregoing external delay replica 121 determines a move-up time in the DLL circuit, the delay circuit 122 shown in FIG. 13, like its name, determines a delay time. Accordingly, the circuit with a delay time of 0 corresponds to a module with 18 devices mounted thereon, the circuit with a delay time corresponding to 4 inverters corresponds to a module with 9 devices mounted thereon, and the circuit with a delay time corresponding to 8 inverters correspond to a module with 4 devices mounted thereon. The delay circuit 122 is the same as the external delay replica 121 shown in FIG. 11, in that these mutually parallelly connected circuits operate only when high-level signals are inputted to corresponding selection terminals ø1, ø2 and ø3, respectively, and in its control method and so on.

The foregoing first embodiment is applicable to a memory module 20 having no ECC function, with the other configuration remaining as it is. In this event, the number of the DRAM devices 50 to be mounted is set to 16. This configuration is obtained by removing, from among the DRAM devices 50 shown in FIG. 2, two adjacent DRAM devices 50 located at rightmost and subsequent positions and, following it, by removing the wirings L7, L7 connected to the removed DRAM devices 50 and the corresponding wiring L6. That is, in the memory module with no ECC function, 8 DRAM devices 50 (4 DRAM devices 50 on each side of the module substrate) are arranged on each side with respect to the branch point P.

In the foregoing first embodiment, it is assumed that the wiring impedance is 63Ω. However, the wiring impedance may take any value within the range of 50 to 65Ω). Further, the wiring lengths are given as only one example of the wiring layout and for reference upon implementation, and never limit alteration thereof.

Second Embodiment

A memory system according to the second embodiment of the present invention is a modification of the foregoing first embodiment. In such a modification, the number of the devices mounted on a memory module 20 is set to 9.

Figure 14:
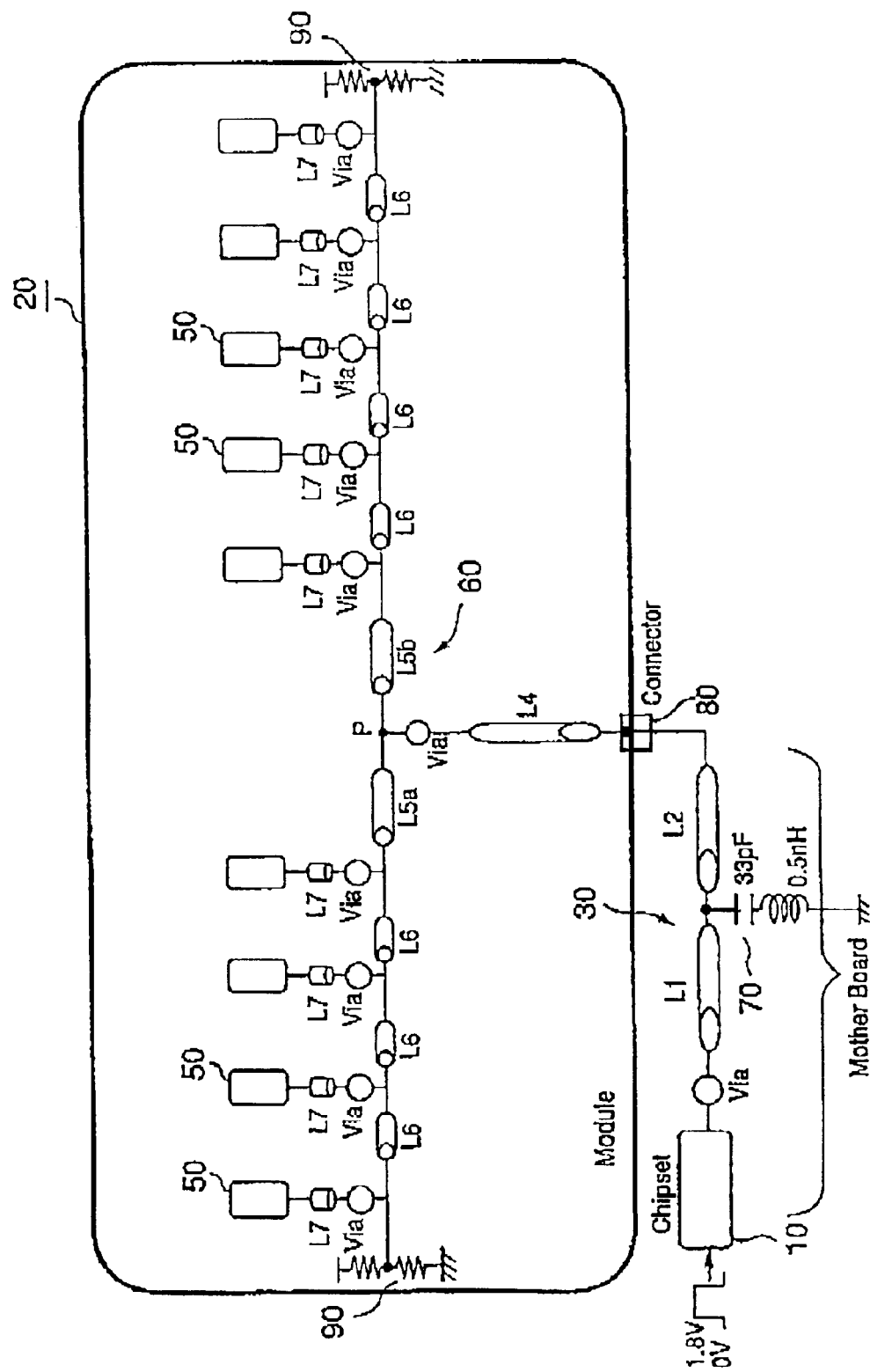
FIG. 14 is a diagram showing a schematic configuration of a memory system according to a second embodiment of the present invention, by paying attention to one memory module.

The memory system according to the second embodiment shown in FIG. 14 differs from the first embodiment in that, other than the mounted device number, a terminating resistor 90 is added to an internal C/A bus 60. This is adopted as a countermeasure because overshoot is caused following the reduction in mounted device number. The other configuration such as a configuration of a chipset 10, an equivalent circuit of a connector 80, an equivalent circuit of a via hole, an equivalent circuit of a DRAM device 50 and so on are like those in the first embodiment, and thus explanation thereof will be omitted hereinbelow. Further, since things related to the output impedance of the chipset 10 are also like in the foregoing first embodiment, explanation thereof will also be omitted hereinbelow.

In the memory system shown in FIG. 14, wiring lengths represented by L1 and L2 in a C/A bus 30 are set to 31.75 mm, respectively, and therefore, also in this embodiment, a capacitor 70 is connected to a position corresponding to the middle point of the C/A bus 30.

As clear from FIG. 14, the memory module 20 in this embodiment is also of the unbuffered type, and the topology of the internal C/A bus 60 is a single T-branch topology. Specifically, the internal C/A bus 60 has a one-step layer wiring topology composed of a first wiring portion (L4, Via) connecting between the connector 80 and a branch point P, and a second wiring portion (L5a, L5b, L6, L7, Via) deriving from the branch point P and extending to reach the respective DRAM devices 50.

In this embodiment, wirings L4, L5a, L5b, L6 and L7 have wiring lengths of 30.0 mm, 12.5 mm, 12.5 mm, 12.0 mm and 1.0 mm, respectively, and the wiring impedance is 63Ω.

As a resistance value of the terminating resistance 90 (in this embodiment, a combined resistance value of upper and lower resistors), it is desirable to use a value matching with an effective impedance of the wiring from a theoretical point of view. Here, the effective impedance of the wiring represents an impedance when seeing the side of the wiring from an end of the wiring (connection point of terminating resistor) in the state where the DRAM devices (memory devices) are added, and normally takes a value lower than the wiring impedance due to the load capacitance of the DRAM devices. On the other hand, the power consumption occurs in the terminating resistor 90 due to the current flowing therethrough, and thus the resistance value of the terminating resistor 90 is preferably set to as high a value as possible. In this event, however, if the resistance value of the terminating resistor 90 is set so high as to deteriorate the waveform characteristic to cause an influence on actual use, it is against the purpose of employing the terminal resistor 90. To summarize the foregoing, the resistance value of the terminating resistor 90 has a value equal to or greater than the effective impedance and, in particular, from an aspect of reducing the power consumption, it is desirable that the resistance value of the terminating resistor 90 be set to as high a value as possible under the condition that no problem is raised with respect to the waveform characteristic upon actual use. In this embodiment, as a value satisfying this condition, the resistance values of the upper and lower resistors are both set to 600Ω (i.e. combined resistance is 300Ω).

In the memory system having the foregoing configuration, the overshoot level can be lowered due to the existence of the terminating resistance 90.

The foregoing second embodiment is applicable to a memory module having no ECC function, with the other configuration remaining as it is. In this event, the number of the DRAM devices to be mounted is set to 8. This configuration is obtained by removing, from among the DRAM devices 50 shown in FIG. 14, the DRAM device 50 located at the rightmost position and, following it, by removing the corresponding wiring L6. That is, in the memory module with no ECC function, 4 DRAM devices 50 (2 DRAM devices 50 on each side of the module substrate) are arranged on each side with respect to the branch point P. Even if the wiring L6 is not removed and remains on the module substrate, no influence is caused on the operation. In view of this, the wiring L6 may be left so as to make it possible to use the same module substrate.

Also in the second embodiment, it is assumed that the wiring impedance is 63Ω. However, the wiring impedance may take any value within the range of 50 to 65Ω). Further, the wiring lengths are given as only one example of the wiring layout and for reference upon implementation, and never limit alteration thereof.

Figure 15:
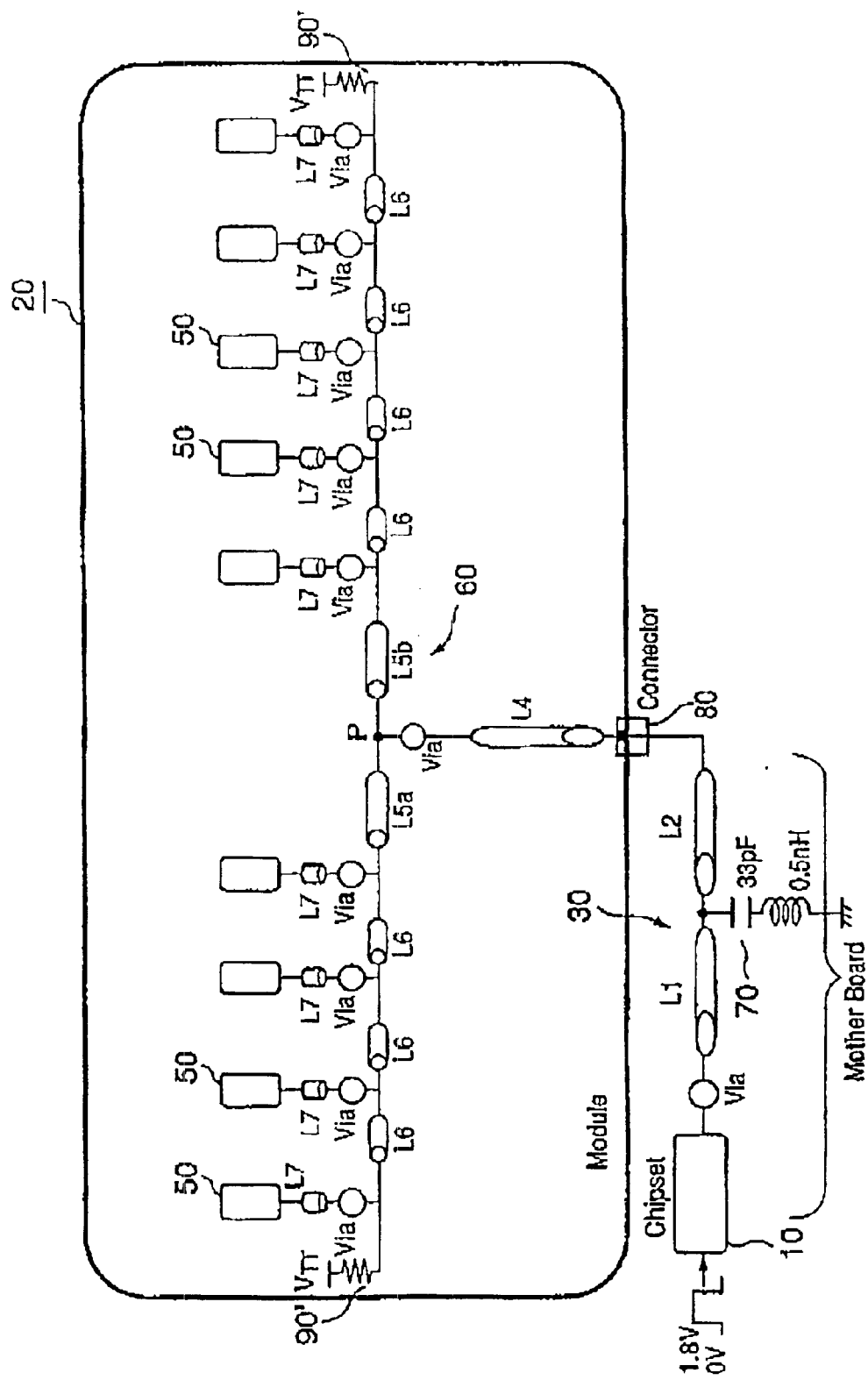
FIG. 15 is a diagram showing a modification of the memory module shown in FIG. 14.

Further, the form of the terminating resistor is not limited to the foregoing resistor ladder and, for example, a terminating resistor 90' as shown in FIG. 15 may be used. In this case, how to determine a resistance value of the terminating resistor 90' is as described above with respect to the terminating resistor 90 shown in FIG. 14. In FIG. 15, $V_{TT}$ is set to a potential that is half of the power supply for memory data input/output. That is, $V_{TT=VDDQ}/2$.

Third Embodiment

Like the second embodiment, a memory system according to the third embodiment of the present invention is provided with a countermeasure for overshoot that is caused by setting the mounted device number to nine.

Figure 16:
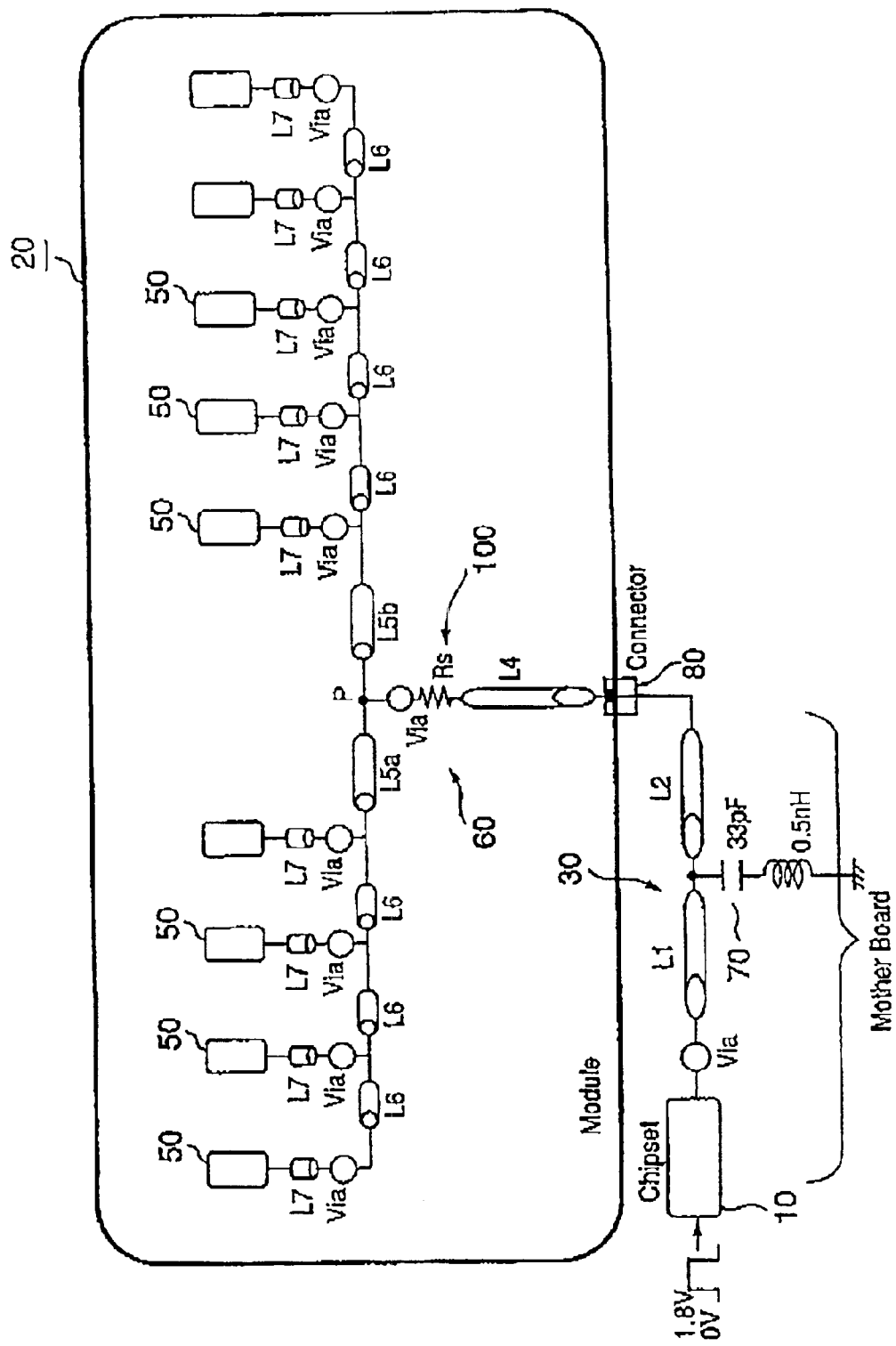
FIG. 16 is a diagram showing a schematic configuration of a memory system according to a third embodiment of the present invention, by paying attention to one memory module.

In the overshoot countermeasure according to this embodiment, a resistor having a predetermined value is inserted on the first wiring portion of the internal C/A bus 60 (i.e. between the connector 80 and the branch point P). Specifically, as shown in FIG. 16, a resistor 100 having a resistance value Rs (=10Ω±20%) is connected in series between the wiring L4 and the branch point P.

With this structure, in addition to the effect achieved by the second embodiment, the overshoot level can be further lowered and, since the power for operating the terminating resistor is not required, the power saving can be accomplished.

Fourth Embodiment

Like the second embodiment, a memory system according to the fourth embodiment of the present invention is provided with a countermeasure for overshoot that is caused by setting the mounted device number to nine.

Figure 17:
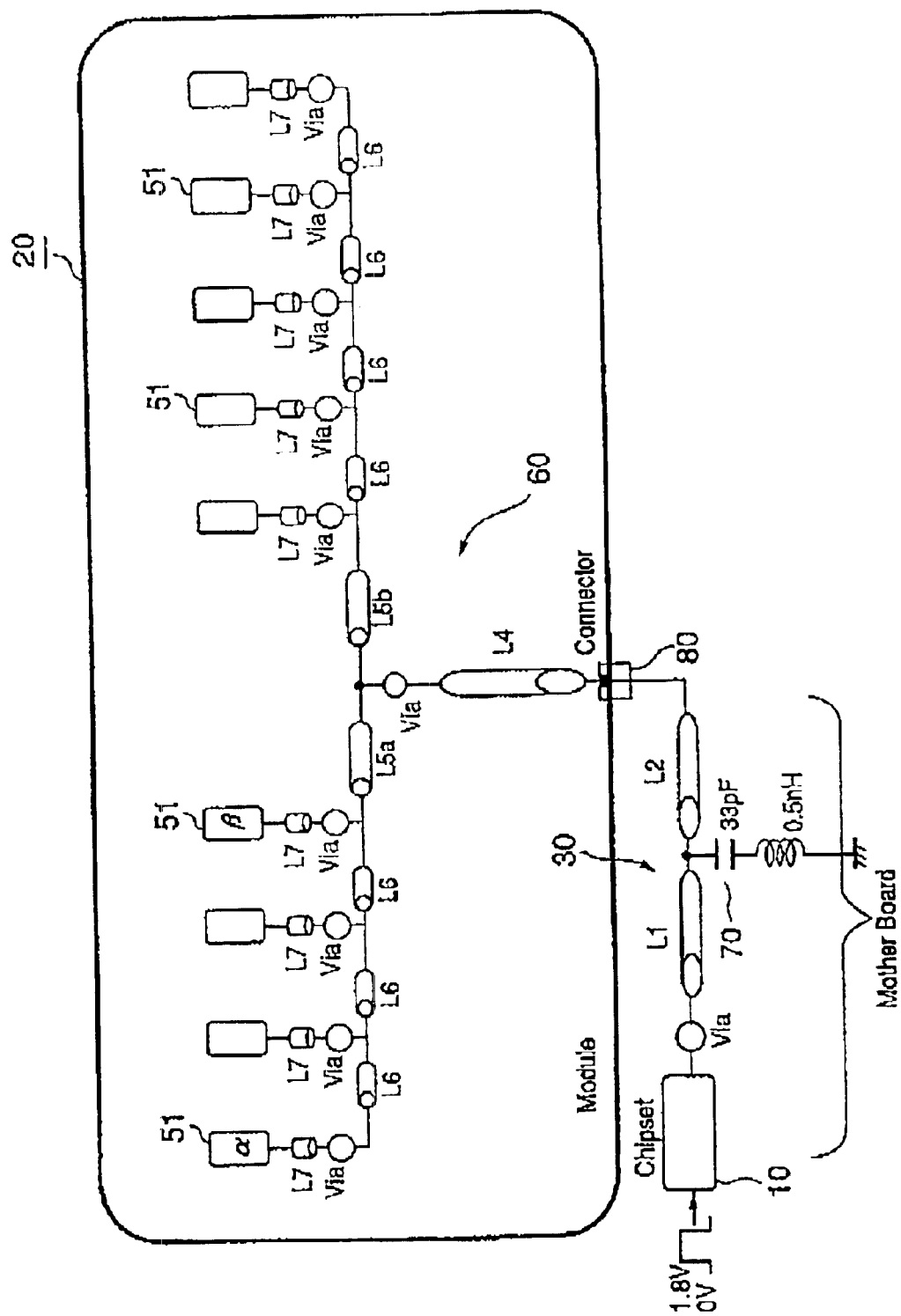
FIG. 17 is a diagram showing a schematic configuration of a memory system according to a fourth embodiment of the present invention, by paying attention to one memory module.
Figure 18:
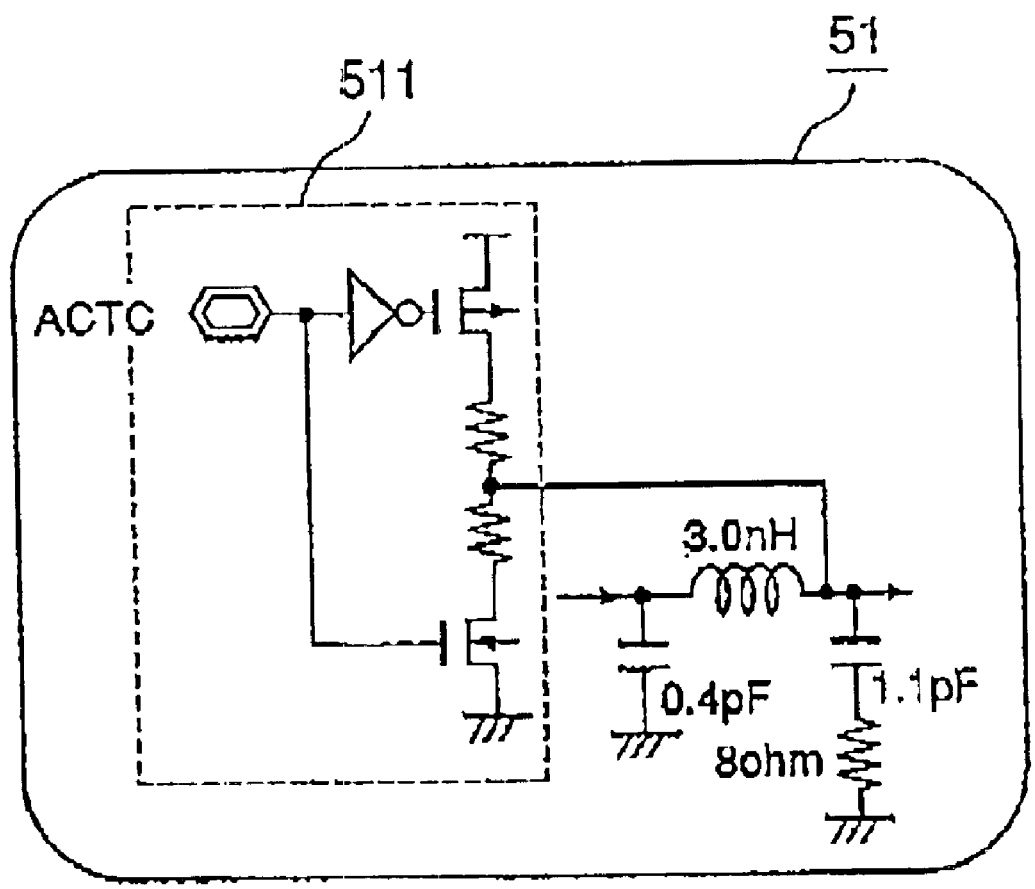
FIG. 18 is a diagram showing an equivalent circuit of a C/A signal input portion and active termination means in a DRAM device 51 shown in FIG. 17.

In the overshoot countermeasure according to this embodiment, as shown in FIGS. 17 and 18, active termination means 511 are provided in each of DRAM devices 51. As clear from comparison with FIG. 4, in FIG. 18, a capacitor of 0.4 pF, a reactance of 3.0 nH, a capacitor of 1.1 pF and a resistor of 8Ω form an equivalent circuit of an input portion for a C/A signal, and the active termination means 511 are added on a transfer path of a C/A signal.

An ACTC (ACtive Termination Control) terminal in the active termination means 511 is for inputting an active termination control signal from the chipset 10 and, when a high-level active termination control signal is given to the ACTC terminal, the active termination means 511 serves as termination means. Here, how to determine resistance values of resistors forming the active termination means 511 is basically the same as the method of determining the foregoing terminating resistor 90. In this embodiment, however, the resistance values should be determined by further taking into account on-resistances of pMOS and nMOS transistors included in the active termination means 511.

Moreover, in this embodiment, the active termination means 511 are activated to function only in the two DRAM devices 51 assigned symbols α and β in the figure for reducing the power consumption and, in the other DRAM devices 51, the ACTC terminals are grounded to prevent the active termination means 511 from functioning.

With such a structure, in addition to the effect achieved by the second embodiment, the layout on the module can be facilitated.

Fifth Embodiment

A memory system according to the fifth embodiment of the present invention is a modification of the foregoing first embodiment, wherein the modification is required due to the fact that the number of the devices mounted on a memory module 20 is set to 5.

Also in the memory system according to this embodiment, like in case of the second embodiment, overshoot is caused following the reduction in mounted device number as compared with the first embodiment, and thus a terminating resistor 90 is added to an internal C/A bus 60 as a countermeasure against overshoot. The other configuration such as a configuration of a chipset 10, an equivalent circuit of a connector 80, an equivalent circuit of a via hole, an equivalent circuit of a DRAM device 50 and so on are like those in the first embodiment, and thus explanation thereof will be omitted hereinbelow. Further, since things related to the output impedance of the chipset 10 are also like in the foregoing first embodiment, explanation thereof will also be omitted hereinbelow. Furthermore, a method of determining the resistance value of the terminating resistor 90 and values themselves in this embodiment are the same as those in the second embodiment, so that explanation thereof will be omitted hereinbelow.

Figure 19:
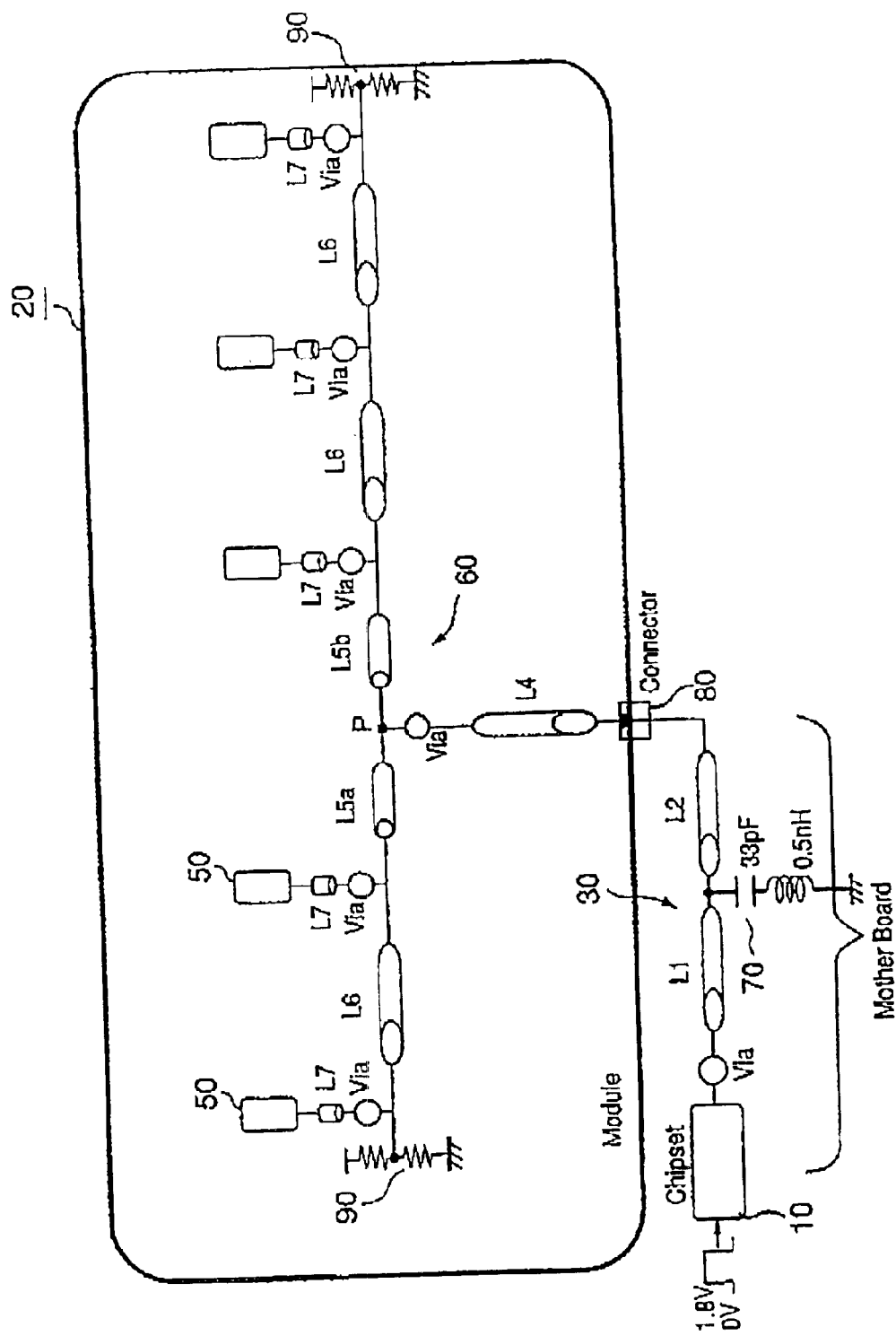
FIG. 19 is a diagram showing a schematic configuration of a memory system according to a fifth embodiment of the present invention, by paying attention to one memory module.

In the memory system shown in FIG. 19, wiring lengths represented by L1 and L2 in a C/A bus 30 are set to 31.75 mm, respectively, and therefore, also in this embodiment, a capacitor 70 is connected to a position corresponding to the middle point of the C/A bus 30.

As clear from FIG. 19, the memory module 20 in this embodiment is also of the unbuffered type, wherein the topology of the internal C/A bus 60 is a single T-branch topology. Specifically, the internal C/A bus 60 has a one-step layer wiring topology composed of a first wiring portion (L4, Via) connecting between the connector 80 and a branch point P, and a second wiring portion (L5a, L5b, L6, L7, Via) deriving from the branch point P and extending to reach the respective DRAM devices 50.

In this embodiment, wirings L4, L5a, L5b, L6 and L7 have wiring lengths of 30.0 mm, 24.5 mm, 24.5 mm, 24.0 mm and 1.0 mm, respectively, and the wiring impedance is 63Ω.

In the memory system having the foregoing configuration, as a result of conducting a simulation assuming that tR/tF (rise time/fall time) of a C/A signal was 500 ps±200 ps, the overshoot level was approximately 0.8V when the terminating resistor 90 was not provided, while the overshoot level was reduced to approximately 0.48V by providing the terminating resistor 90.

The fifth embodiment is applicable to a memory module having no ECC function, with the other configuration remaining as it is. In this event, the number of the DRAM devices to be mounted is set to 4. This configuration is obtained by removing, from among the DRAM devices 50 shown in FIG. 19, the DRAM device 50 located at the rightmost position and, following it, by removing the rightmost wiring L6. That is, in the memory module with no ECC function, 2 DRAM devices 50 (one DRAM device 50 on each side of the module substrate) are arranged on each side with respect to the branch point P. Even if the wiring L6 is not removed and remains on the module substrate, no influence is caused on the operation. In view of this, the wiring L6 may be left so as to make it possible to use the same module substrate.

Also in the fifth embodiment, it is assumed that the wiring impedance is 63Ω. However, the wiring impedance may take any value within the range of 50 to 65Ω. Further, the wiring lengths are given as only one example of the wiring layout and for reference upon implementation, and never limit alteration thereof.

Figure 20:
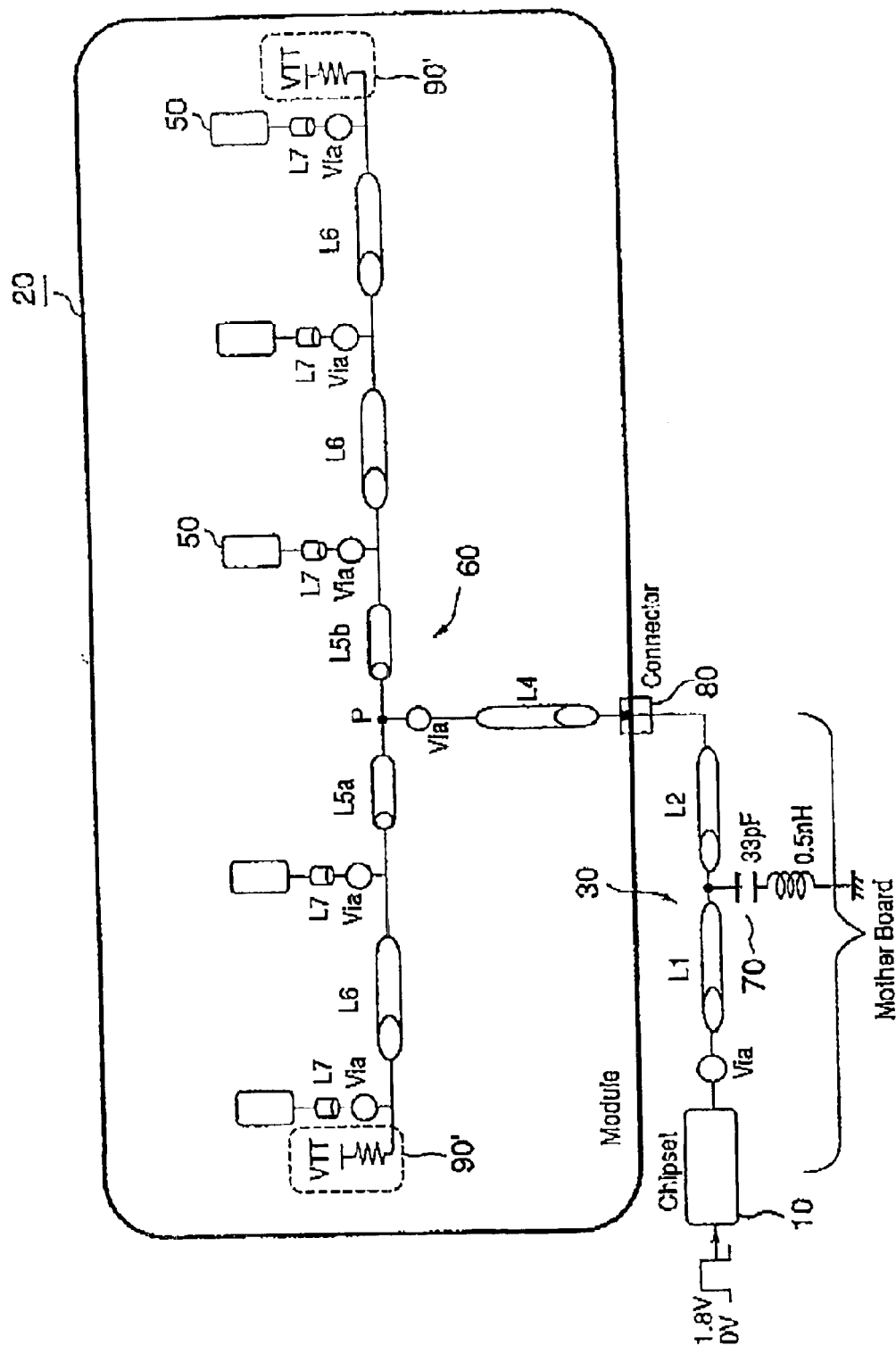
FIG. 20 is a diagram showing a modification of the memory module shown in FIG. 19.

Further, the form of the terminating resistor is not limited to the foregoing resistor ladder and, for example, a terminating resistor 90' as shown in FIG. 20 may be used. In this case, how to determine a resistance value of the terminating resistor 90' is as described above with respect to the terminating resistor 90 in the second embodiment (see FIG. 14). In FIG. 20, $V_{TT}$ is set to a potential that is half of the power supply for memory data input/output. That is, $V_{TT}=V_{DDQ}/2$.

Sixth Embodiment

Figure 21:
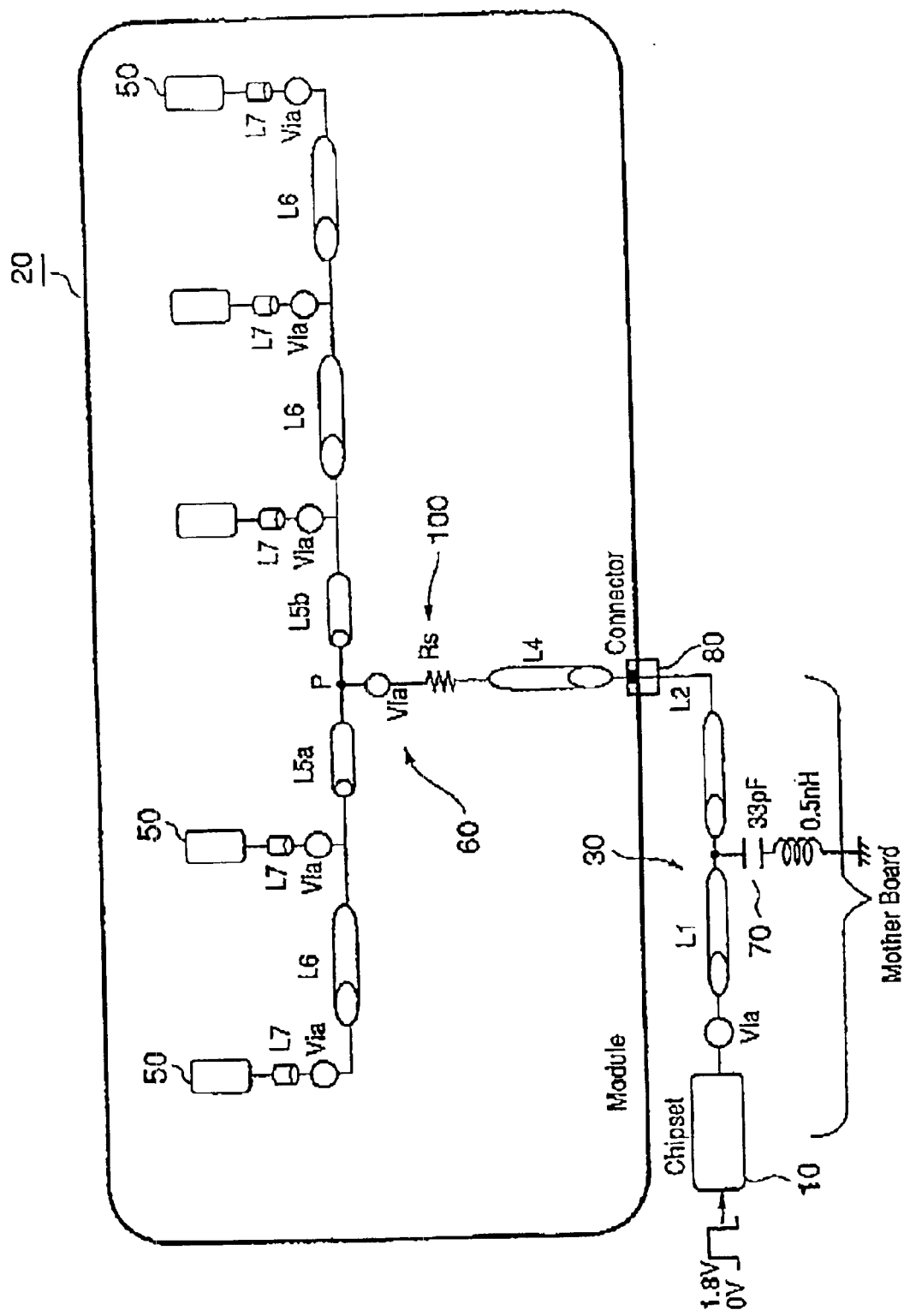
FIG. 21 is a diagram showing a schematic configuration of a memory system according to a sixth embodiment of the present invention, by paying attention to one memory module.

Like the fifth embodiment, a memory system according to the sixth embodiment of the present invention is provided with a countermeasure for overshoot that is caused by setting the mounted device number to five, In the overshoot countermeasure according to this embodiment, like in the third embodiment, a resistor having a predetermined value is inserted on the first wiring portion of the internal C/A bus 60 (i.e. between the connector 80 and the branch point P). Specifically, as shown in FIG. 21, a resistor 100 having a resistance value Rs (=25Ω±20%) is connected in series between the wiring L4 and the branch point P.

In the memory system having the foregoing configuration, as a result of conducting a simulation assuming that tR/tF (rise time/fall time) of a C/A signal was 500 ps±200 ps, the overshoot level was approximately 0.8V when the resistor 100 was not provided, while the overshoot level was reduced to approximately 0.25V by providing the resistor 100.

As described above, according to the configuration of this embodiment, in addition to the effect achieved by the fifth embodiment, the overshoot level can be further lowered and, since the power for operating the terminating resistance is not required, the power saving can be accomplished.

Seventh Embodiment

A memory system according to the seventh embodiment of the present invention corresponds to the modification in the fifth embodiment and is applied with the concept of the fourth embodiment, and is provided with a countermeasure for overshoot that is caused by setting the mounted device number to four.

Figure 22:
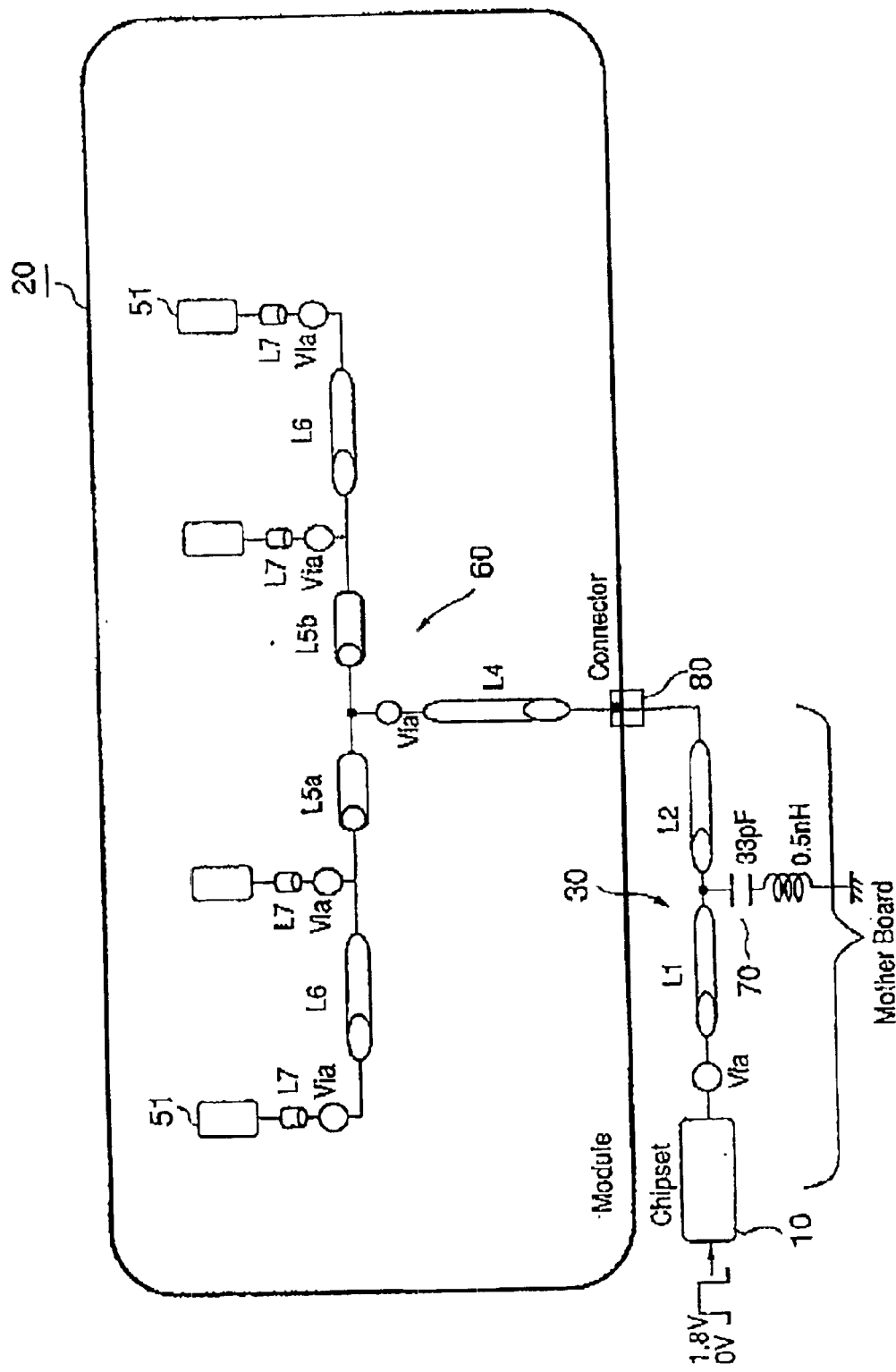
FIG. 22 is a diagram showing a schematic configuration of a memory system according to a seventh embodiment of the present invention, by paying attention to one memory module.

Specifically, in the overshoot countermeasure according to this embodiment, as shown in FIG. 22 (see also FIG. 18), active termination means 511 are provided in each of DRAM devices 51. Since the active termination means 511 itself is the same as that in the foregoing fourth embodiment, explanation thereof is omitted.

Also in this embodiment, the active termination means 511 are activated to function only in the outer two DRAM devices 51 in the figure for reducing the power consumption and, in the other DRAM devices 51, the ACTC terminals are grounded to prevent the active termination means 511 from functioning.

According to the foregoing configuration, in addition to the effect achieved by the fifth embodiment, the layout on the module can be facilitated.

The memory system of the present invention has been described via various embodiments, but the concept of the present invention is not limited to those embodiments.

In the foregoing first to fifth embodiments, the C/A signal propagation delay times caused by a difference in mounted device number are absorbed (dealt with) on the side of the chipset 10. However, this may be dealt with on the side of the memory module 20. Specifically, depending on the mounted device number, the lengths of the wirings constituting the internal C/A bus may be adjusted or the capacitor are added to the wirings. More specifically, it may be arranged that the initial layout including the wiring layout is designed taking into account the module size and so on, while, characteristics of the chipset 10, the C/A bus 30 and so on, which are memory system constituting elements other than the memory module 20, are set so as to correspond to a particular number of the mounted devices among the expected mounted device numbers, and thereafter, with respect to the memory modules 20 with the mounted devices whose numbers are other than the particular number of the mounted devices, the wiring lengths are adjusted or the capacitors are added to the wirings, taking in account differences between a C/A signal transfer delay time in case of the particular number of the mounted devices and C/A signal transfer delay times in the memory modules with the mounted devices whose numbers are other than the particular number of the mounted devices. Similarly, instead of adjusting the wiring lengths, the wiring impedances of the respective wiring portions forming the internal C/A bus may be adjusted.

For better understanding, explanation will be again made citing concrete numerical values. For example, first, the initial layout is performed taking into account the module size and so on, and measurement of a propagation delay time based on the initial layout is carried out. This measurement was performed through a simulation in this embodiment. On the other hand, among the expected mounted device numbers (in this example, 5, 9, 18), 18 is assumed to be a particular number of the mounted devices and, by subtracting a propagation delay time based on the initial layout of the module with 5 or 9 mounted devices from a propagation delay time based on the initial layout of the module with the particular number (18) of the mounted devices, a time difference therebetween is obtained. Then, changing of the wiring lengths or addition of the capacitors on the wiring layout is carried out so as to reduce the time difference, preferably to zero. Specifically, assuming that the particular mounted device number is 18 (C/A signal propagation delay time=2.8 ns), adjustment of the wiring lengths or addition of the capacitors may be performed with respect to the memory module with 9 mounted devices (C/A signal propagation delay time=2.5 ns) so as to prolong a propagation delay time by 2.8 ns−2.5 ns=0.3 ns, while, adjustment of the wiring lengths or addition of the capacitors may be performed with respect to the memory module with 5 mounted devices (C/A signal propagation delay time=2.0 ns) so as to prolong a propagation delay time by 2.8 ns−2.0 ns=0.8 ns. In this event, for calculating a rough adjusting amount, a general equation of a propagation delay time tPD given by tPD=$\sqrt{L \times C}$, for example, may be used, and thereafter, fine adjustment may be performed while repeating simulations. By adopting such a designing technique, designing of a memory module that can absorb a difference in propagation delay time corresponding to the mounted device number can be carried out in a short term and in the optimum state. In the foregoing example, the expected mounted device numbers are assumed to be 5, 9 and 18. However, the designing method according to the present invention is not limited to those mounted device numbers.

As described above, according to the present invention, when a memory module of the unbuffered type with ECC function is employed, an internal C/A bus configuration is set to a single T-branch topology, the output impedance of a memory controller is maintained substantially constant, and the capacitor for cutting high-frequency components of a C/A signal is added on a signal bus, thereby to obtain an unbuffered memory system that is adaptive to high-frequency operation.

What is claimed is:

1. An unbuffered memory system, comprising:

an unbuffered memory module mounted thereon with a plurality of memory devices;

a memory controller for sending a command/address signal to all of said memory devices mounted on said memory module, and a signal bus connecting between said memory module and said memory controller to propagate said command/address signal from said memory controller to said memory module, wherein said memory module comprises a connector connected to said signal bus, and a module wiring connecting between said connector and said memory devices, and said module wiring has a one-step layer configuration comprising a first wiring portion extending from said connector to a branch point, and a second wiring portion deriving from said branch point and extending to reach said memory devices.

2. An unbuffered memory system according to claim 1, wherein:
said memory controller is configured such that when seeing said memory controller from a connection point between said signal bus and said memory controller, an output impedance with respect to said command/address signal is maintained substantially constant in an operating voltage range of said command/address signal.

3. An unbuffered memory system according to claim 2, wherein:
said memory controller comprises an output transistor and a resistance element inserted in series between an output end of said output transistor and said connection point, and
a resistance value of said resistance element is selected taking into account an on-resistance value of said output transistor so as to satisfy a condition about said output impedance.

4. An unbuffered memory system according to claim 1, wherein:
said memory controller comprises an output transistor,
said unbuffered memory system further comprises a resistance element connected in series between said memory controller and said signal bus, and
a resistance value of said resistance element is selected taking into account an on-resistance value of said output transistor such that when seeing the side of said memory controller from a connection point between said resistance element and said signal bus, an output impedance with respect to said command/address signal is maintained substantially constant in an operating voltage range of said command/address signal.

5. An unbuffered memory system according to claim 1, wherein:
said memory controller comprises an output terminal for outputting said command/address signal, an output transistor, and an internal resistance element inserted in series between an output end of said output transistor and said output terminal of said memory controller,
said unbuffered memory system further comprises an external resistance element connected in series between said output terminal of said memory controller and said signal bus, and
a total resistance value of said internal resistance element and said external resistance element is selected taking into account an on-resistance value of said output transistor such that when seeing the side of said memory controller from a connection point between said external resistance element and said signal bus, an output impedance with respect to said command/address signal is maintained substantially constant in an operating voltage range of said command/address signal.

6. An unbuffered memory system according to claim 1, further comprising:
a capacitor having a first and a second end, wherein said first end is connected to said signal bus, and a fixed potential is supplied to said second end.

7. An unbuffered memory system according to claim 1, wherein:
said memory controller comprises an output timing adjusting circuit for adjusting a timing of outputting said command/address signal, and
said adjusted timing is variable and determined according to the number of said memory devices mounted on said memory module.

8. An unbuffered memory system according to claim 7, wherein:
said output timing adjusting circuit comprises a plurality of delay circuits corresponding to types of an expected mounted number of said memory devices, each of said delay circuits producing a delay corresponding to the mounted number of said memory devices, and said output timing adjusting circuit is configured such that when the mounted number of said memory devices is determined, one of said delay circuits is selectable.

9. An unbuffered memory system according to claim 7, wherein:
said memory controller operates based on an external clock signal supplied from an exterior,
said output timing adjusting circuit comprises
a DLL (Delay Locked Loop) circuit that receives said external clock signal and produces an internal clock signal by adjusting a delay amount,
a latch circuit for latching a command/address signal for a predetermined time according to said internal clock signal,
an internal delay replica connected to said DLL circuit and showing a delay time from said internal clock signal to outputting of said command/address signal corresponding to said internal clock signal, and
a plurality of delay circuits connected to said internal delay replica and said DLL circuit, and operating as an external delay replica for determining said predetermined time in said latch circuit, and
said plurality of delay circuits produce delays corresponding to an expected mounted number of said memory devices, respectively, and are configured such that when the mounted number of said memory devices is determined, one of said delay circuits is selectable.

10. An unbuffered memory system according to claim 1, wherein:
depending on the number of said memory devices mounted on said memory module, wiring lengths of the first wiring portion and the second wiring portion of said module wiring are determined, and/or an additional capacitor is connected to said module wiring.

11. An unbuffered memory system according to claim 1, wherein:
when the number of said memory devices mounted on said memory module is within a predetermined range, said memory module further comprises a terminating resistor added to said second wiring portion, and said terminating resistor has a resistance value equal to or greater than an effective impedance of said module wiring.

12. An unbuffered memory system according to claim 1, wherein:
when the number of said memory devices mounted on said memory module is 4 or 5, said memory module further comprises a resistance element inserted in series in said first wiring portion, and a resistance value of said resistance element is within a range of $25\Omega \pm 20\%$.

13. An unbuffered memory system according to claim 1, wherein:
when the number of said memory devices mounted on said memory module is 8 or 9, said memory module further comprises a resistance element inserted in series in said first wiring portion, and a resistance value of said resistance element is within a range of $10\Omega \pm 20\%$.

14. An unbuffered memory system according to claim 1, wherein:
each of said memory devices mounted on said memory module comprises active termination means and an active termination terminal connected to said active termination means, and when the number of said memory devices mounted on said memory module is within a predetermined range, said active termination means provided in a predetermined number of the memory devices among all said memory devices function.

15. An unbuffered memory system according to claim 14, wherein:

the number of said memory devices mounted on said memory module is 9, two memory devices among said memory devices are designed such that said active termination means thereof function, and said active termination terminals of the memory devices other than said two memory devices designed that said active termination means thereof function, are grounded.

16. An unbuffered memory system according to claim 1, wherein:

said memory devices are mounted on said memory module such that the number of memory devices disposed on right and left sides with respect to said branch point are equal to each other.

17. An unbuffered memory system according to claim 1, wherein:

said memory devices are mounted on said memory module such that the number of memory devices disposed on right and left sides with respect to said branch point are unequal to each other.

18. An unbuffered memory system according to claim 1, wherein:

said memory devices and said module wiring are not terminated.

19. An unbuffered memory system according to claim 1, wherein:

an operating frequency of said command/address signal is equal to or greater than 100 MHz.

20. A memory controller for use in a memory system, wherein:

said memory controller comprises an unbuffered memory module mounted thereon with a plurality of memory devices, and a signal bus connected to said unbuffered memory module, and sends a command/address signal to all of said memory devices mounted on said unbuffered memory module via said signal bus; and said memory controller has an output impedance that is, when seeing said memory controller from a portion that is connection point between said signal bus and said memory controller, maintained substantially constant in an operating voltage range of said command/address signal.

21. A memory controller according to claim 20, wherein:

said memory controller comprises an output transistor and a resistance element inserted in series between an output end of said output transistor and said connection point, and a resistance value of said resistance element is selected taking into account an on-resistance value of said output transistor so as to satisfy a condition about said output impedance.

22. A memory controller for use a memory system, wherein:

said memory controller comprises an unbuffered memory module mounted thereon with a plurality of memory devices, a signal bus connected to said unbuffered memory module, and an external resistance element connected in series to said signal bus, and sends a command/address signal to all of said memory devices mounted on said unbuffered memory module via said signal bus; and said memory controller further comprises an output terminal for outputting said command/address signal, an output transistor, and an internal resistance element inserted in series between an output end of said output transistor and said output terminal of said memory controller;

wherein a resistance value of said internal resistance element is selected taking into account an on-resistance value of said output transistor and a resistance value of said external resistance element such that when seeing the side of said memory controller from a connection point between said external resistance element and said signal bus, an output impedance with respect to said command/address signal is maintained substantially constant in an operating voltage range of said command/address signal.

23. A memory controller according to any one of claims 20 to 22, wherein said memory controller comprises:

a command/address producing circuit for producing said command/address signal;

an output circuit for outputting said command/address signal; and an output timing adjusting circuit disposed between said command/address producing circuit and said output circuit for adjusting a timing in which said command/address signal produced by said command/address producing circuit is outputted from said output circuit, and wherein said timing is determined according to the number of said memory devices mounted on said memory module.

24. A memory controller according to claim 23, wherein:

said output timing adjusting circuit comprises a plurality of delay circuits corresponding to types of an expected mounted number of said memory devices, each of said delay circuits producing a delay corresponding to the mounted number of said memory devices, and said output timing adjusting circuit is configured such that when the mounted number of said memory devices is determined, one of said delay circuits is selectable.

25. A memory controller according to claim 23, wherein:

said memory controller operates based on an external clock signal supplied from the exterior, said output timing adjusting circuit comprises a DLL (Delay Locked Loop) circuit that receives said external clock signal and produces an internal clock signal by adjusting a delay amount, a latch circuit for latching a command/address signal for a predetermined time according to said internal clock signal, an internal delay replica connected to said DLL circuit and showing a delay time from said internal clock signal to outputting of said command/address signal corresponding to said internal clock signal, and a plurality of delay circuits connected to said internal delay replica and said DLL circuit, and operating as an external delay replica for determining said predetermined time in said latch circuit, and said plurality of delay circuits produce delays corresponding to an expected mounted number of said memory devices, respectively, and are configured such that when the mounted number of said memory devices is determined, one of said delay circuits is selectable.

26. An unbuffered memory module for use in a memory system including a memory controller for sending a command/address signal, and a signal bus connected to said memory controller, wherein:

said unbuffered memory module comprising:

a module substrate, a connector provided at an end portion of said module substrate, a plurality of memory devices mounted on said module substrate, and a module wiring formed on said module substrate and connecting between said connector and said plurality of memory devices, wherein said module wiring comprises a first wiring portion extending from said connector to a branch point, and a second wiring portion deriving from said branch point and extending to reach said memory devices.

27. An unbuffered memory module according to claim 26, wherein:

depending on the number of said memory devices mounted on said module substrate, wiring lengths of the first wiring portion and the second wiring portion of said module wiring are determined, and/or an additional capacitor is connected to said module wiring.

28. An unbuffered memory module according to claim 26, wherein:

said memory devices are mounted on said module substrate such that the number of memory devices disposed on right and left sides with respect to said branch point are equal to each other.

29. An unbuffered memory module according to claim 26, wherein:

said memory devices are mounted on said module substrate such that the number of memory devices disposed on right and left sides with respect to said branch point are unequal to each other.

30. An unbuffered memory module according to claim 26, wherein:

said memory devices and said module wiring are not terminated.

31. An unbuffered memory module according to claim 26, further comprising:

a terminating resistor connected to said second wiring portion, wherein said terminating resistance has a resistance value equal to or greater than an effective impedance of said module wiring.

32. An unbuffered memory module according to claim 26, further comprising:

a resistance element inserted in series in said first wiring portion when the number of said memory devices mounted on said module substrate is 4 or 5, wherein a resistance value of said resistance element is within a range of $25\Omega \pm 20\%$.

33. An unbuffered memory module according to claim 26, further comprising:

a resistance element inserted in series in said first wiring portion when the number of said memory devices mounted on said module substrate is 8 or 9, wherein a resistance value of said resistance element is within a range of $10\Omega \pm 20\%$.

34. An unbuffered memory module according to claim 26, wherein:

each of said memory devices mounted on said module substrate comprises active termination means and an active termination terminal connected to said active termination means, and it is designed that, depending on the number of said memory devices mounted on said module substrate, said active termination means provided in a predetermined number of the memory devices among all said memory devices function.

35. An unbuffered memory module according to claim 34, wherein:

the number of said memory devices mounted on said module substrate is 9, two memory devices among said memory devices are designed such that said active termination means thereof function, and said active termination terminals of the memory devices other than said two memory devices designed that said active termination means thereof function, are grounded.

36. A method of designing an unbuffered memory module for use in an unbuffered memory system comprising the unbuffered memory module mounted thereon with a plurality of memory devices, a memory controller for sending a command/address signal to all of said memory devices mounted on said memory module, and a signal bus connecting between said memory module and said memory controller to propagate said command/address signal from said memory controller to said memory module, wherein when there are a plurality of cases with respect to an expected number of said memory devices mounted on said memory module in said unbuffered memory system, even if a memory module with any number, in said expected number, of the mounted memory devices is incorporated into said unbuffered memory system, a take-in margin of said command/address signal in said memory devices can be secured, said method comprising:

a first step of determining an initial layout including a wiring layout with respect to each of unbuffered memory modules corresponding to said plurality of cases;

a second step of measuring a transfer delay time of a command/address signal according to each initial layout determined at the first step;

a third step of setting one of the unbuffered memory modules of the plurality of cases for which the initial layouts are determined at the first step, as a specific unbuffered memory module;

a fourth step of, based on the transfer delay times measured at the second step, deriving differences between the transfer delay time corresponding to said specific unbuffered memory module and the transfer delay times corresponding to the other unbuffered memory modules; and a fifth step of, based on the differences in transfer delay time derived at the fourth step, changing said initial layout of the corresponding unbuffered memory module in said unbuffered memory modules other than said specific unbuffered memory module, such that the corresponding difference is reduced to substantially zero.

37. A method according to claim 36, wherein:

said fifth step comprises steps of adjusting wiring lengths of respective wirings in said wiring layout, and/or connecting an additional capacitor on said wiring layout.

* * * * *